US009040415B2

(12) United States Patent
Park et al.

(10) Patent No.: US 9,040,415 B2
(45) Date of Patent: May 26, 2015

(54) SEMICONDUCTOR DEVICE AND METHOD OF FABRICATING THE SAME

(71) Applicant: Samsung Electronics Co., Ltd., Suwon-Si, Gyeonggi-Do (KR)

(72) Inventors: Sang-Jine Park, Yongin-si (KR); Bo-Un Yoon, Seoul (KR); Young-Sang Youn, Suwon-si (KR); Jeong-Nam Han, Seoul (KR); Kee-Sang Kwon, Seoul (KR); Doo-Sung Yun, Yongin-si (KR); Byung-Kwon Cho, Suwon-si (KR); Ji-Hoon Cha, Seoul (KR)

(73) Assignee: Samsung Electronics Co., Ltd., Gyeongggi-do (KR)

( * ) Notice: Subject to any disclaimer, the term of this patent is extended or adjusted under 35 U.S.C. 154(b) by 0 days.

(21) Appl. No.: 14/286,108

(22) Filed: May 23, 2014

(65) Prior Publication Data
US 2015/0050793 A1    Feb. 19, 2015

(30) Foreign Application Priority Data

Aug. 16, 2013    (KR) .................. 10-2013-0097254

(51) Int. Cl.
*H01L 21/4763*    (2006.01)
*H01L 29/66*    (2006.01)
(52) U.S. Cl.
CPC .... *H01L 29/66477* (2013.01); *H01L 29/66553* (2013.01)

(58) Field of Classification Search
None
See application file for complete search history.

(56) References Cited

U.S. PATENT DOCUMENTS

| | | | |
|---|---|---|---|
| 6,613,681 B1 | 9/2003 | Hillyer et al. | |
| 6,693,040 B2 | 2/2004 | Kim | |
| 6,847,085 B2 | 1/2005 | Hillyer et al. | |
| 7,122,463 B2 | 10/2006 | Ohuchi | |
| 7,498,247 B2 | 3/2009 | Ahn et al. | |

FOREIGN PATENT DOCUMENTS

| | | |
|---|---|---|
| JP | 05047720 B2 | 10/2012 |
| KR | 20000009277 A | 2/2000 |
| KR | 20080074494 A | 8/2008 |
| KR | 20100036449 A | 4/2010 |

*Primary Examiner* — Cheung Lee
(74) *Attorney, Agent, or Firm* — Harness, Dickey & Pierce, P.L.C.

(57) ABSTRACT

A method for forming a trench includes etching an oxide layer to form a trench therein, conformally forming a first reaction layer along a surface of the trench, the first reaction layer including a first region on an upper portion of the trench and a second region on a lower portion of the trench, forming a barrier layer by reacting a first amount of etching gas with the first region of the first reaction layer, and etching the oxide layer on a lower portion of the second region by reacting a second amount of etching gas with the second region of the first reaction layer, the second amount of etching gas being greater than the first amount of etching gas.

20 Claims, 19 Drawing Sheets

US 9,040,415 B2

SEMICONDUCTOR DEVICE AND METHOD OF FABRICATING THE SAME

CROSS-REFERENCE TO RELATED APPLICATION

This application claims priority from Korean Patent Application No. 10-2013-0097254 filed on Aug. 16, 2013 in the Korean Intellectual Property Office, and all the benefits accruing therefrom under 35 U.S.C. 119, the contents of which in its entirety are herein incorporated by reference.

BACKGROUND

1. Field

The present inventive concept relates to a method for forming a trench of a semiconductor device and a method for fabricating the semiconductor device.

2. Description of the Related Art

With the recent trend toward highly integrated semiconductor devices, a design rule of a semiconductor device is continuously decreasing. Accordingly, semiconductor devices requiring small power consumption and high speed are widely used. As the line width of the semiconductor device becomes finer, various methods for scaling down have been proposed.

In order to form a trench and/or a hole, in the course of fabricating a semiconductor device, etching or cleaning process steps are performed. In this stage, a width of the trench or the hole may increase, so that a peripheral device, for example, the trench or the hole, may be exposed, resulting in damages or bridge formation.

SUMMARY

Example embodiments of the present inventive concepts provide a method for forming a trench of a semiconductor device, which can improve the reliability of the semiconductor device by etching only a lower portion of the semiconductor device, for example, a trench or a hole.

Example embodiments of the present inventive concepts also provide a method for fabricating a semiconductor device, which can improve the reliability of the semiconductor device by etching only a lower portion of the semiconductor device, for example, a trench or a hole.

Example embodiments of the present inventive concepts will be described in or be apparent from the following description.

According to example embodiments of the present inventive concepts, a method for forming a trench of a semiconductor device includes etching an oxide layer to form a trench therein, conformally forming a first reaction layer along a surface of the trench, the first reaction layer including a first region on an upper portion of the trench and a second region on a lower portion of the trench, forming a barrier layer by reacting a first amount of etching gas with the first region of the first reaction layer, and etching the oxide layer on a lower portion of the second region by reacting a second amount of etching gas with the second region of the first reaction layer, the second amount of etching gas being greater than the first amount of etching gas.

According to example embodiments of the present inventive concepts, a method for fabricating a semiconductor device includes etching an insulation layer to form a trench therein, the insulation layer including a first region and a second region, conformally forming a first reaction layer along a surface of the insulation layer, forming a barrier layer by reacting an etching gas with the first reaction layer on a top surface of the first region, the first region being etched to a first thickness, and etching the second region to a second thickness greater than the first thickness by reacting the etching gas with the first reaction layer on a top surface of the second region.

According to example embodiments of the present inventive concepts, a method for forming a trench of a semiconductor device includes etching an insulation layer to form a trench therein, the insulation layer including a first region and a second region, conformally forming a first reaction layer along a surface of the trench, forming a barrier layer by reacting a first amount of etching gas at a first pressure with the first reaction layer on a top surface of the first region, and etching the insulation layer by reacting a second amount of etching gas at a second pressure with the first reaction layer on a top surface of the second region, the second pressure being less than the first pressure and the second amount of etching gas being greater than the first amount of etching gas.

BRIEF DESCRIPTION OF THE DRAWINGS

The above and other features and advantages of the present inventive concepts will become more apparent by describing in detail example embodiments thereof with reference to the attached drawings in which.

DETAILED DESCRIPTION OF THE EMBODIMENTS

Figure 1:
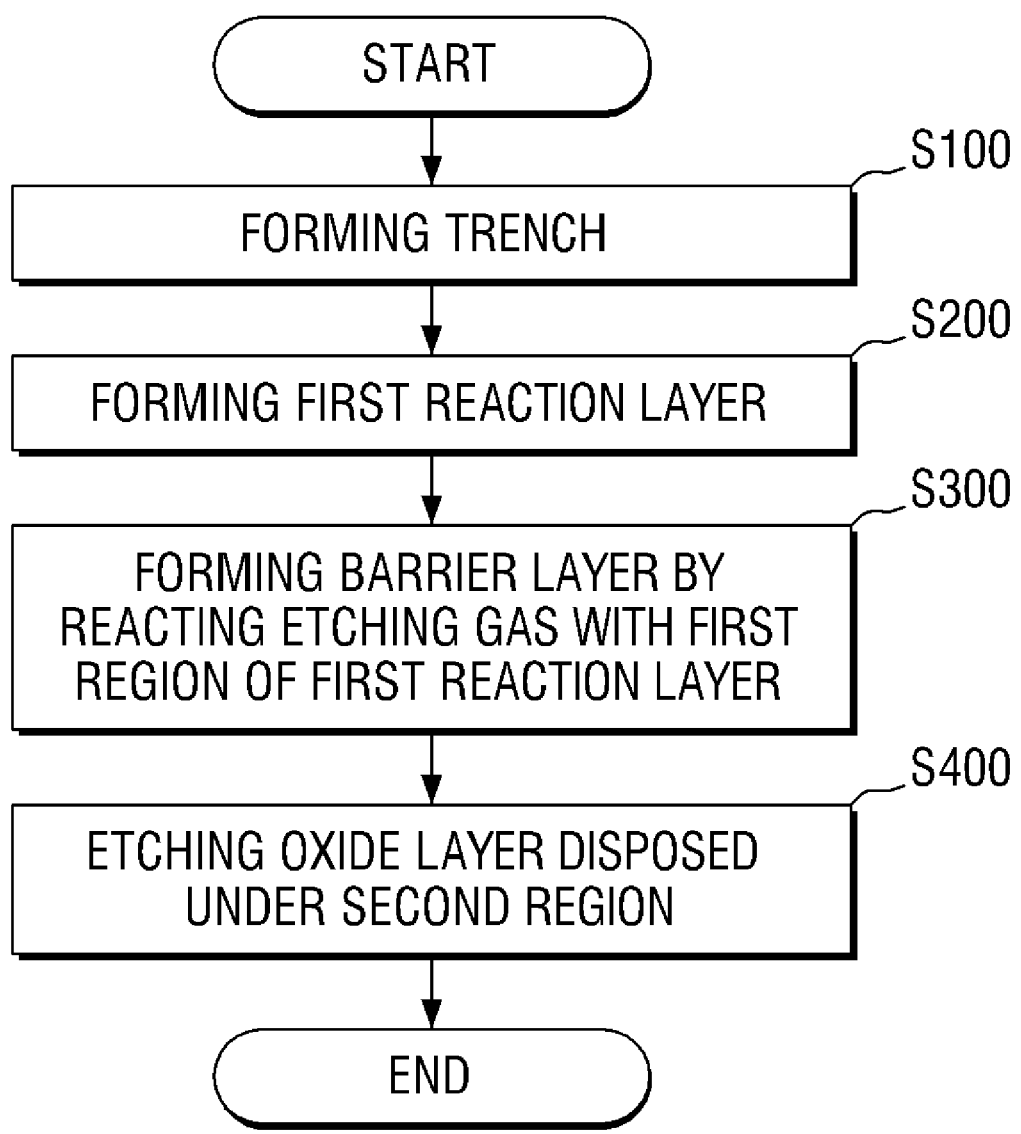
FIG. 1 is a flowchart illustrating a method for forming a trench of a semiconductor device according to example embodiments of the present inventive concepts.

Advantages and features of example embodiments of the present inventive concepts and methods of accomplishing the same may be understood more readily by reference to the following detailed description of example embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and example embodiments of the present inventive concepts will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments of the present inventive concepts.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments of the present inventive concepts.

Unless otherwise defined, all terms (including technical and scientific terms) used herein have the same meaning as commonly understood by one of ordinary skill in the art to which example embodiments of the present inventive concepts belong. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a method for forming a trench of a semiconductor device according to example embodiments of the present inventive concepts will be described with reference to FIGS. 1 to 6.

FIG. 1 is a flowchart illustrating a method for forming a trench of a semiconductor device according to example embodiments of the present inventive concepts, and FIGS. 2 to 6 illustrate intermediate process steps of the method for forming the trench of the semiconductor device according to example embodiments of the present inventive concepts.

Figure 2:
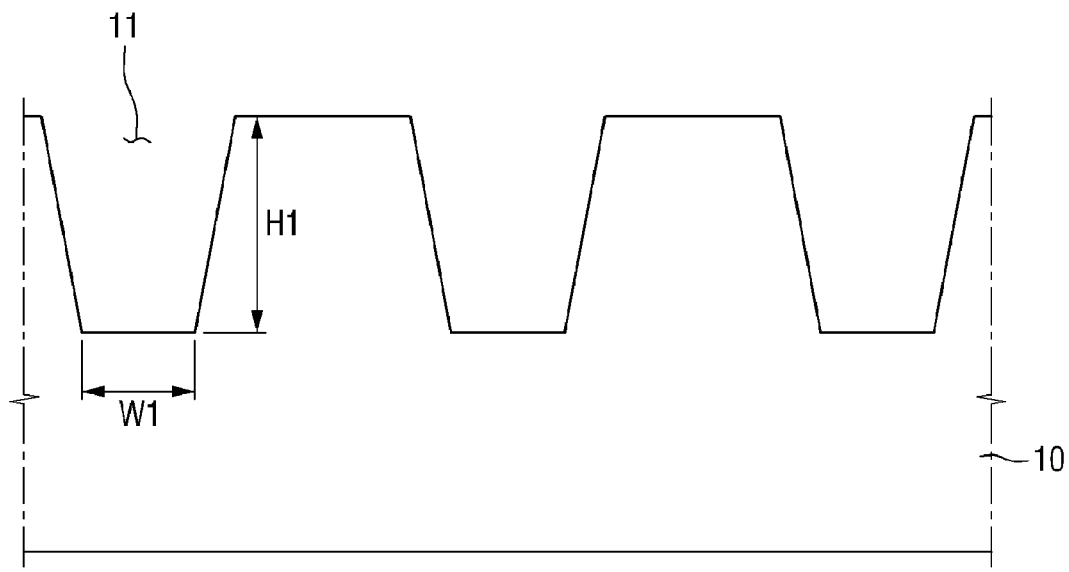
FIGS. 2 to 6 illustrate intermediate process steps of the method for forming the trench of the semiconductor device according to example embodiments of the present inventive concepts.

Referring to FIGS. 1 and 2, a first trench 11 is formed in an insulation layer 10 (S100). The insulation layer 10 may be formed by, for example, chemical vapor deposition (CVD). The insulation layer 10 may be an oxide layer, for example, a silicon oxide layer, but aspects of example embodiments of the present inventive concepts are not limited thereto. The insulation layer 10 may be formed using a tetraethylortho silicate (TEOS) gas.

In FIG. 2, the insulation layer 10 is a single layer, but aspects of example embodiments of the present inventive concepts are not limited thereto. The insulation layer 10 may include multiple layers.

The first trench 11 is formed in the insulation layer 10. The first trench 11 may be formed by forming a photoresist pattern on a top surface of the insulation layer 10, except for a region where the first trench 11 is formed, and etching the top surface of the insulation layer 10. The etching for forming the first trench 11 may be, for example, and may use CF4 as an etching gas, but aspects of example embodiments of the present inventive concepts are not limited thereto. That is to say, the first trench 11 may be formed by various methods, that is to say, by various etching methods.

A height H1 of the first trench 11 and a width W1 of a bottom surface of the first trench 11 may be arbitrarily determined according to the size and/or use of the semiconductor device.

In the illustrated embodiment upper and lower widths of the first trench 11 are different from each other, but aspects of example embodiments of the present inventive concepts are not limited thereto. That is to say, the upper and lower widths of the first trench 11 may be equal to each other.

Figure 3:
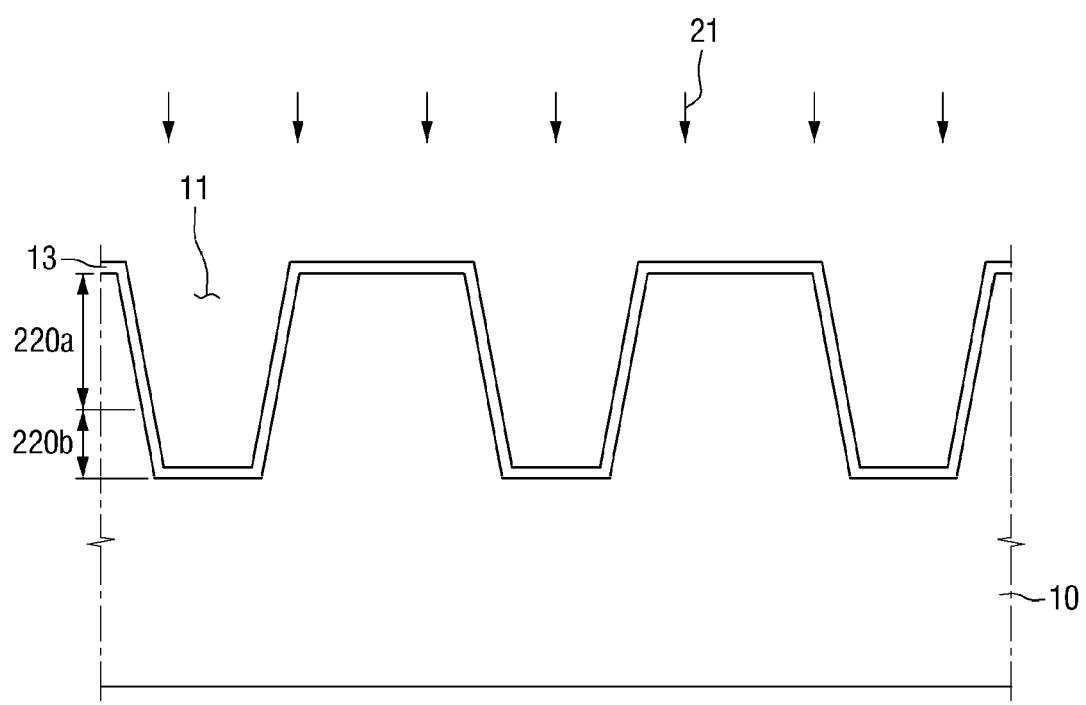

Referring to FIGS. 1 and 3, a first reaction layer 13 is conformally formed along a surface of the first trench 11. The first reaction layer 13 may be formed by, for example, CVD. The first reaction layer 13 may also be formed on the top surface of the insulation layer 10. The first reaction layer 13 may include $NH_3$.

The first reaction layer 13 in the first trench 11 may be divided by a first region 13a and a second region 13b. The first region 13a of the first reaction layer 13 may be disposed at an upper portion of the first trench 11 and the second region 13b of the first reaction layer 13 may be disposed at a lower portion of the first trench 11. The first region 13a is a potential region where a barrier layer 15 to later be described is to be formed.

Figure 4:
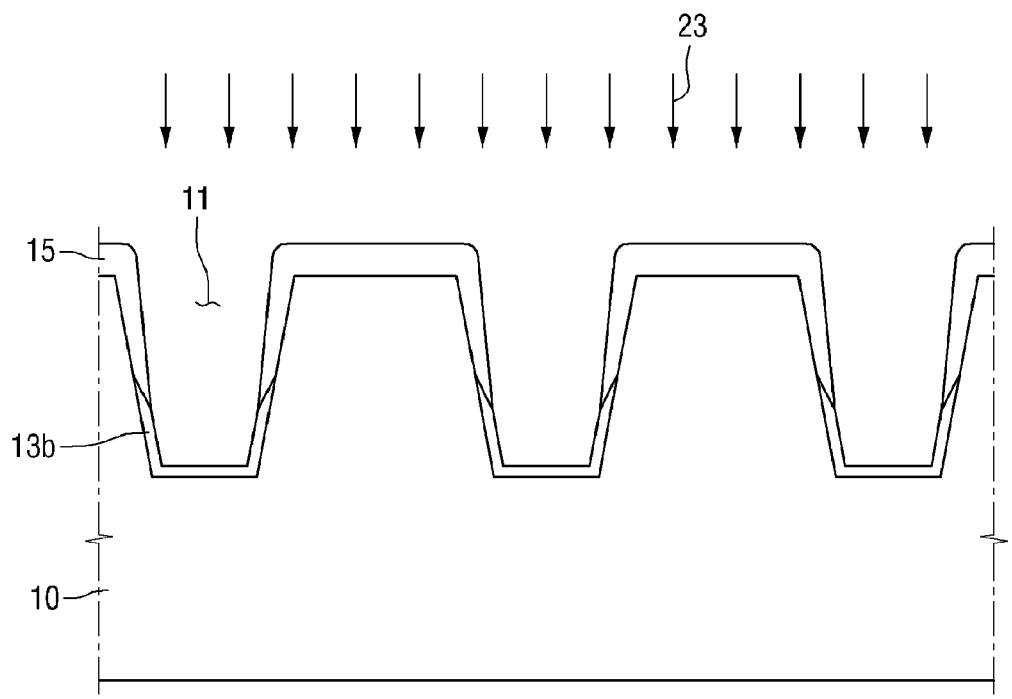
Figure 5:
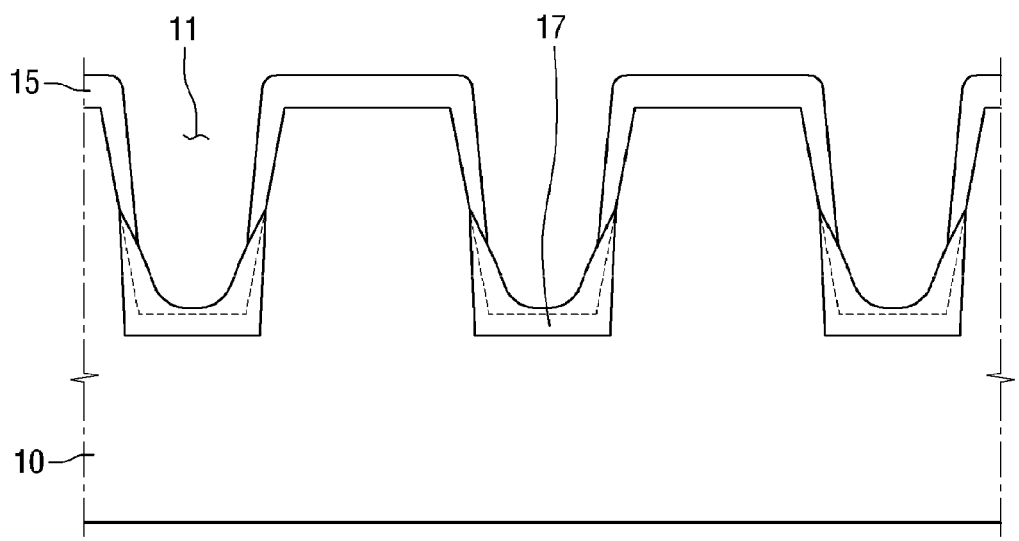

Referring to FIGS. 1, 3 and 4, the barrier layer 15 is formed by reacting a first amount of etching gas 21 with the first region 13a of the first reaction layer 13 (S300).

As shown in FIG. 3, the first reaction layer 13 is formed in the first trench 11, and the first amount of etching gas 21 is supplied. Referring to FIG. 4, the first amount of etching gas 21 reacts with the first region 13a of the first reaction layer 13, thereby forming the barrier layer 15.

The first amount of etching gas 21 may include fluorine (F). For example, the etching gas 21 may include at least one of HF and $HF_3$.

$NH_3$ and HF or $HF_3$ may be used in a dry etching process. Therefore, the insulation layer 10 included an oxide layer (e.g., $SiO_2$) may be etched by reacting with $NH_3$, HF or $HF_3$ $F_3$. However, if the first amount of etching gas 21 is supplied in a small amount and at a low pressure, it has low energy to react with only the first reaction layer 13 without reacting with the insulation layer 10. That is to say, the first amount of etching gas 21 slowly reacts with the first reaction layer 13, thereby forming the barrier layer 15.

Because the first amount of etching gas 21 is supplied in a small amount and at a low pressure to then have low energy, it cannot reach the lower portion of the first trench 11. Therefore, the first reaction layer 13 not reacting with the first amount of etching gas 21 is present at the lower portion of the first trench 11. The first region 13a of the first reaction layer 13 is a region in which the first reaction layer 13 reacts with the first amount of etching gas 21, and the second region 13b of the first reaction layer 13 is a region in which the first reaction layer 13 does not react with the first amount of etching gas 21. Areas of the first region 13a and the second region 13b may vary according to the amount and/or pressure of the first amount of etching gas 21. For example, as the amount of the first amount of etching gas 21 increases, the area of the second region 13b of the first reaction layer 13 may be reduced and the area of the first region 13a of the first reaction layer 13 may increase. The area of the first region 13a of the first reaction layer 13 is large enough to completely cover the bottom surface of the first trench 11.

Because the first reaction layer 13 is formed on the top surface of the insulation layer 10 as well, the first reaction layer 13 and the first amount of etching gas 21 react with each other, thereby forming the barrier layer 15 on the top surface of the insulation layer 10 as well.

Referring to FIG. 1, the second amount of etching gas 23 reacts with the second region 13b of the first reaction layer 13 to etch the oxide layer disposed at a lower portion of the second region 13b of the first reaction layer 13 (S400). In order to etch the oxide layer, that is, the insulation layer 10, as shown in FIG. 4, a second amount of etching gas 23 is supplied. The second amount may be greater than the first amount, and the second amount of etching gas 23 may be supplied at a high pressure. Because the second amount of etching gas 23 is greater than the first amount of etching gas 21 in view of the amount and energy, it may reach the lower portion of the first reaction layer 13 to react with the second region 13b of the first reaction layer 13 and to etch the insulation layer 10 disposed at the lower portion of the second region 13b of the first reaction layer 13.

Like the first amount of etching gas 21, the second amount of etching gas 23 may include at least one of HF and $HF_3$. In addition, in order to effectively etch the insulation layer 10 disposed at the lower portion of the second region 13b of the first reaction layer 13, the second amount of etching gas 23 may further include at least one of an inert gas, $N_2$ and $NH_3$. If the second amount of etching gas 23 further includes at least one of an inert gas, $N_2$ and $NH_3$, the reaction between the second amount of etching gas 23 and the insulation layer 10 may be facilitated.

If the second amount of etching gas 23 is supplied, the second region 13b of the first reaction layer 13 and the insulation layer 10 disposed at the lower portion of the second region 13b of the first reaction layer 13 may react with each other. Accordingly, a second reaction layer 17 is formed at a portion where the second region 13b of the first reaction layer 13 is present, while etching the insulation layer 10 disposed at the lower portion of the second region 13b of the first reaction layer 13. Because the second amount of etching gas 23 cannot react with the insulation layer 10 at a portion where the barrier layer 15 is formed due to the presence of the barrier layer 15, the insulation layer 10 is not etched.

The second amount of etching gas 23, the second region 13b of the first reaction layer 13 and the insulation layer 10 disposed at the lower portion of the second region 13b of the first reaction layer 13 may react with one another, thereby forming the second reaction layer 17 in the first trench 11.

Figure 6:
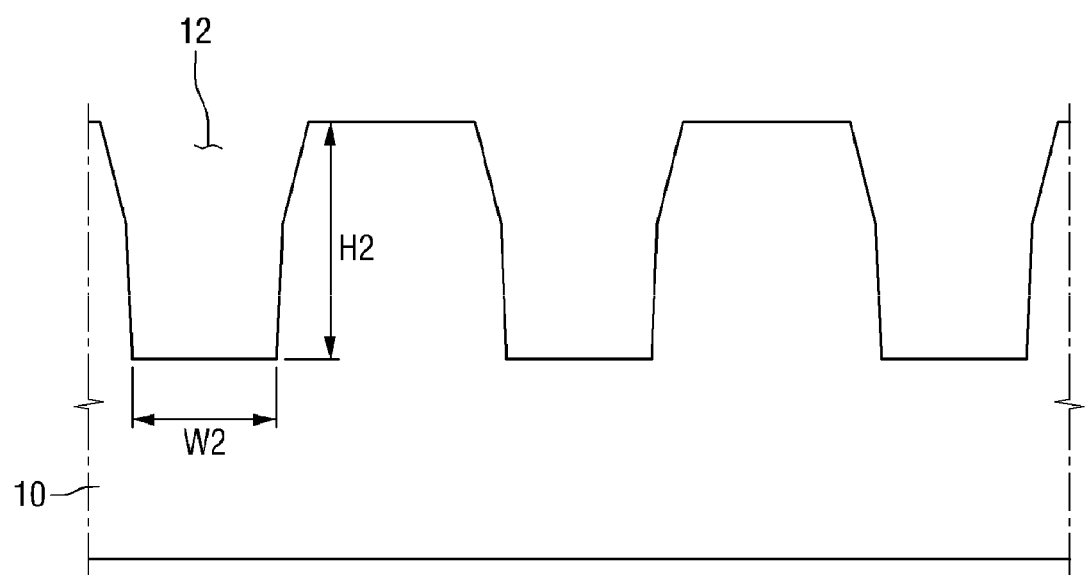

If post heat treatment (PHT) is performed on the insulation layer 10, the first reaction layer 15 and the second reaction layer 17 are evaporated for removal. Eventually, only the insulation layer 10 disposed at the lower portion of the second region 13b of the first reaction layer 13 is etched, thereby forming a second trench 12, as shown in FIG. 6.

Because the insulation layer 10 disposed at the lower portion of the first trench 11 is etched, a width W2 of a bottom surface of the second trench 12 is longer than the width W1 of the bottom surface of the first trench 11, and a height H2 of the second trench 12 is greater than the height H1 of the first trench 11.

If a trench is formed according to example embodiments of the present inventive concepts, only the lower portion of the trench can be selectively etched while not etching the upper portion of the trench. Therefore, it is possible to prevent or reduce a critical dimension (CD) from increasing the upper portion of the trench when the trench is formed, thereby improving the reliability of the semiconductor device.

A method for forming a trench of a semiconductor device according to example embodiments of the present inventive concepts will be described with reference to FIGS. 7 and 8. Repeated descriptions will be omitted and the following description will focus on differences between the embodiments.

Figure 7:
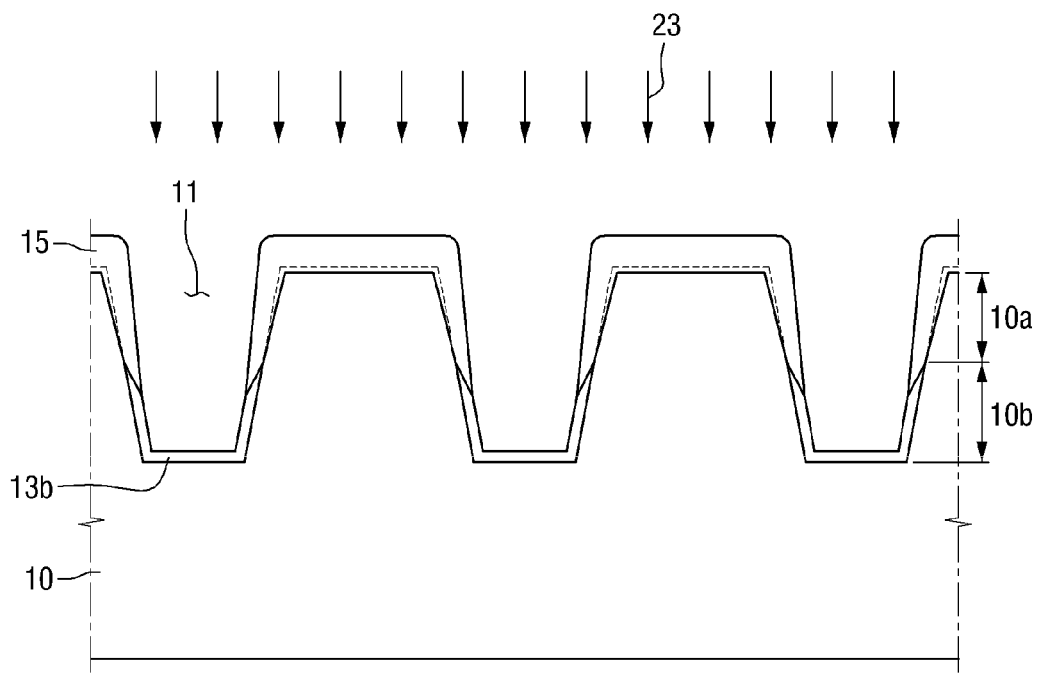
FIGS. 7 and 8 illustrate intermediate process steps of a method for forming a trench of a semiconductor device according to example embodiments of the present inventive concepts.
Figure 8:
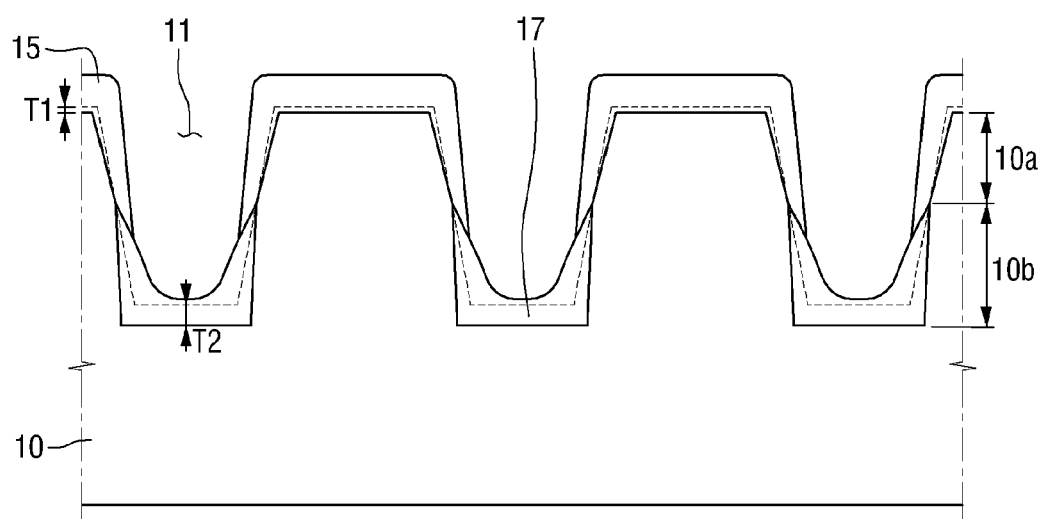

FIGS. 7 and 8 illustrate intermediate process steps of a method for forming a trench of a semiconductor device according to example embodiments of the present inventive concepts.

Like in FIGS. 2 and 3, the method for forming the trench of the semiconductor device according to example embodiments of the present inventive concepts includes forming a first trench 11 in an insulation layer 10 and conformally forming a first reaction layer 13 on a surface of the first trench 11.

Referring to FIGS. 3 and 7, a first amount of etching gas 21 reacts with a first region 13a of the first reaction layer 13, thereby forming a barrier layer 15. Here, unlike in the method for forming the trench of the semiconductor device according to example embodiments of the present inventive concepts, an insulation layer 10 disposed at a lower portion of the first region 13a of the first reaction layer 13 may partially react with the first amount of etching gas 21.

In detail, the insulation layer 10 may be divided into a first region insulation layer 10a disposed at the lower portion of the first region 13a of the first reaction layer 13 and a second region insulation layer 10b disposed at the lower portion of the second region 13b of the first reaction layer 13. The first amount of etching gas 21 may react with the first region 13a of the first reaction layer 13, thereby forming a barrier layer 15. Here, the first amount of etching gas 21 may react with a portion of the first region insulation layer 10a, thereby partially etching the first region insulation layer 10a. The first region insulation layer 10a is etched by only a small amount, which is too negligible to affect performance of the semiconductor device.

Because the first amount of etching gas 21 is supplied in a small amount and at a low pressure, it cannot reach the second region 13b of the first reaction layer 13 disposed at the lower portion of the first trench 11, so that the second region 13b of the first reaction layer 13 remains without being etched.

As shown in FIG. 7, a second amount of etching gas 23 is provided to etch the second region insulation layer 10b disposed at the lower portion of the second region 13b of the first reaction layer 13, as shown in FIG. 8. A reaction between the first region insulation layer 10a and the second amount of etching gas 23 is not caused due to the presence of the barrier layer 15, so that only the second region insulation layer 10b may react with the second amount of etching gas 23 to then be etched. The second amount of etching gas 23, the second region 13b of the first reaction layer 13 and the second region insulation layer 10b may react with one another, thereby forming a second reaction layer 17 at the lower portion of the first trench 11.

Compared to the second region insulation layer 10b, the first region insulation layer 10a is etched by only a small amount. In detail, the first region insulation layer 10a is etched as much as a first thickness T1, and the second region insulation layer 10b is etched as much as a second thickness T2. Here, the second thickness T2 may be greater than the first thickness T1. The first thickness T1 is too small to affect performance of the semiconductor device. In addition, the method for forming the trench of the semiconductor device according to example embodiments of the present inventive concepts may exert the same effect as the method for forming the trench of the semiconductor device according to example embodiments of the present inventive concepts.

If post heat treatment (PHT) is performed, the barrier layer 15 and the second reaction layer 17 are removed. Eventually, the trench having only its lower portion selectively etched can be formed.

A method for forming a trench of a semiconductor device according to example embodiments of the present inventive concepts will be described with reference to FIGS. 9 to 14. Repeated descriptions will be omitted and the following description will focus on differences between the embodiments.

FIGS. 9 to 14 illustrate intermediate process steps of a method for forming a trench of a semiconductor device according to example embodiments of the present inventive concepts.

Figure 9:
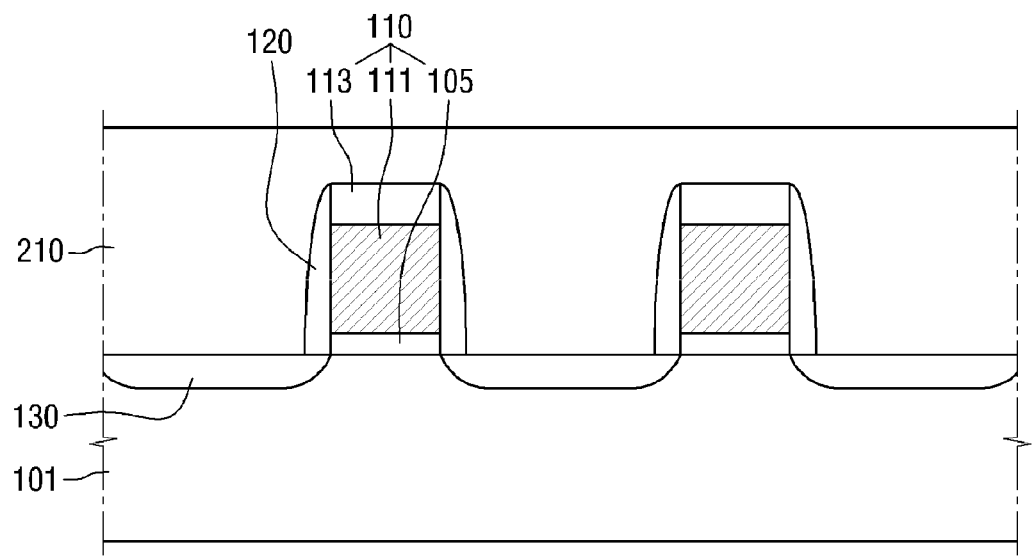
FIGS. 9 to 14 illustrate intermediate process steps of a method for forming a trench of a semiconductor device according to example embodiments of the present inventive concepts.

Referring to FIG. 9, an interlayer dielectric layer 210 is formed, the interlayer dielectric layer 210 covering a substrate 101 and a gate structure 110 formed on the substrate 101.

The substrate 101 may be a single crystalline silicon substrate, a polysilicon substrate or a silicon substrate formed by selectively epitaxial growth, but not limited thereto.

The gate structure 110 may include a gate insulation layer 105, a gate electrode 111 and a hard mask layer 113. The gate insulation layer 105 may be formed on the substrate 101. For example, the gate insulation layer 105 may include a silicon oxide layer, SiON, $Ge_xO_yN_z$, $Ge_xSi_yO_z$, a high-k material, combinations thereof, and a stacked layer including these materials sequentially stacked. Examples of the high-k material may include $HfO_2$, $ZrO_2$, $Al_2O_3$, $Ta_2O_5$, hafnium silicate, zirconium silicate, and combinations thereof.

The gate electrode 111 may be formed on the gate insulation layer 105. For example, the gate electrode 111 may include a single layer, for example, a polysilicon layer, a silicide layer or a metal layer, or a stacked layer having these layers stacked one on another.

The hard mask layer 113 may be formed on the gate electrode 111.

A source/drain 130 may be formed in the substrate 101 of at least one of both sides of the gate structure 110. The source/drain 130 may be doped with N or P type impurity.

In addition, as shown, a spacer 120 may be formed on either sidewall of the gate structure 110. In the illustrated embodiment, the spacer 120 is formed of a single layer, but aspects of example embodiments of the present inventive concepts are not limited thereto. The spacer 120 may be formed of multiple layers.

The forming of the gate structure 110 on the substrate 101 may be performed by a process well known in the art, but not limited thereto.

The interlayer dielectric layer 210 may be formed by, for example, CVD. In the illustrated embodiment, the interlayer dielectric layer 210 formed of a single layer is exemplified. Alternatively, the interlayer dielectric layer 210 may also be formed of a composite layer. The interlayer dielectric layer 210 may be an oxide layer.

Figure 10:
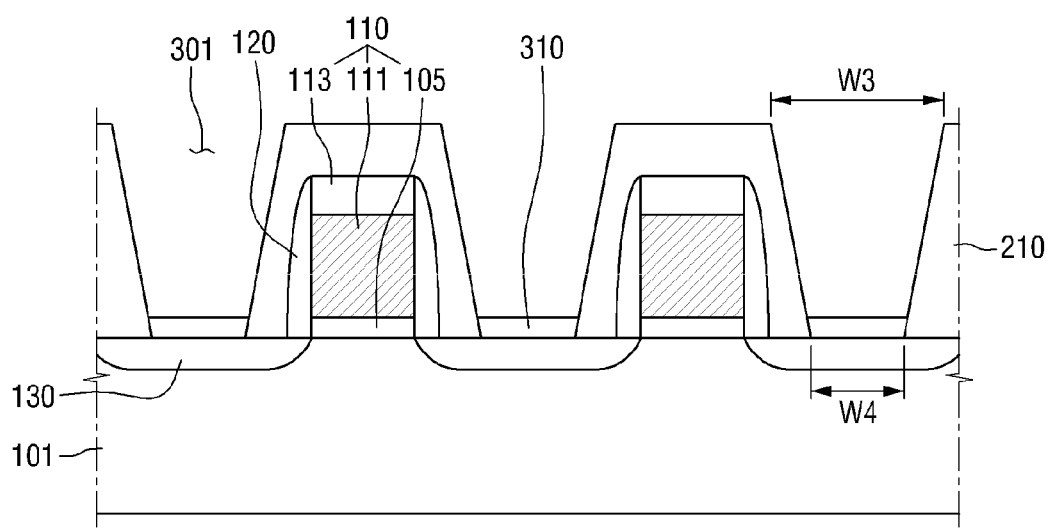

Referring to FIG. 10, a first trench 301 is formed in the interlayer dielectric layer 210.

The first trench 301 may be formed on a source/drain 130. In FIG. 10, upper and lower widths of the first trench 301 are different from each other, but aspects of example embodiments of the present inventive concepts are not limited thereto. However, the upper and lower widths of the first trench 301 may be equal to each other.

In order to form the first trench 301, a photoresist pattern (not shown) may be formed on the interlayer dielectric layer 210 to mask the remaining region of the interlayer dielectric layer 210, except for a potential region where the first trench 301 is formed, and the potential region exposed by the photoresist pattern is etched, thereby forming the first trench 301 exposing a top surface of the source/drain 130. The etching may include, for example, dry etching, but aspects of example embodiments of the present inventive concepts are not limited thereto.

When the first trench 301 is formed on the source/drain 130, a natural thin film 310 is formed on a top surface of the source/drain 130. An etching gas used in the etching for forming the first trench 301 may interact with oxygen contained in the interlayer dielectric layer 210. Accordingly, a thin film may be formed on the top surface of the source/drain 130 exposed by the first trench 301. The natural thin film 310 may be an oxide layer. The natural thin film 310 may have varying thicknesses according to processing conditions, including a processing time for the etching for forming the first trench 301.

As shown in FIG. 10, the natural thin film 310 may be formed on the top surface of the source/drain in the first trench 301. That is to say, the natural thin film 310 may be formed on the top surface of the source/drain 130 exposed by the first trench 301. When the substrate 101 is a silicon substrate, the natural thin film 310 may include, for example, Si, O, F, C and N.

Figure 11:
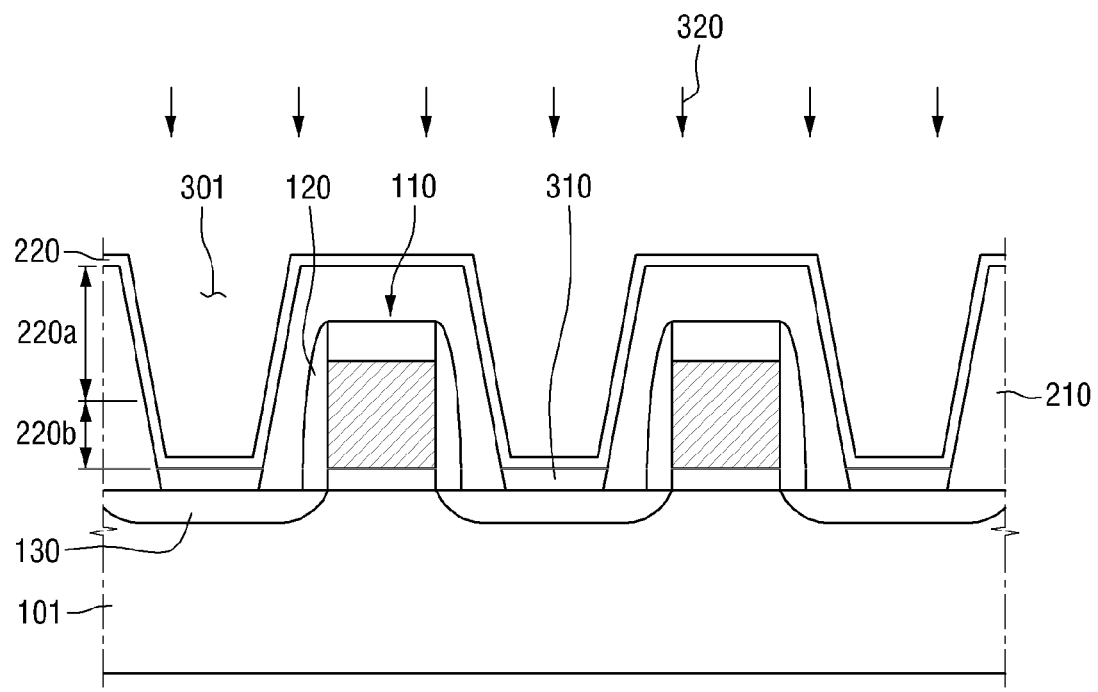

Referring to FIG. 11, a first reaction layer 220 is formed in the first trench 301. The first reaction layer 220 may be conformally formed along sidewalls of the first trench 301 and a top surface of the natural thin film 310. In addition, the first reaction layer 220 may be formed on the top surface of the interlayer dielectric layer 210. The first reaction layer 220 may include $NH_3$.

The first reaction layer 220 may be divided into a first region 220a reacting with a first amount of etching gas 320 and a second region 220b reacting with a second amount of etching gas 330 while not reacting with the first amount of etching gas 320.

After the first reaction layer 220 is formed, the first amount of etching gas 320 is supplied.

Figure 12:
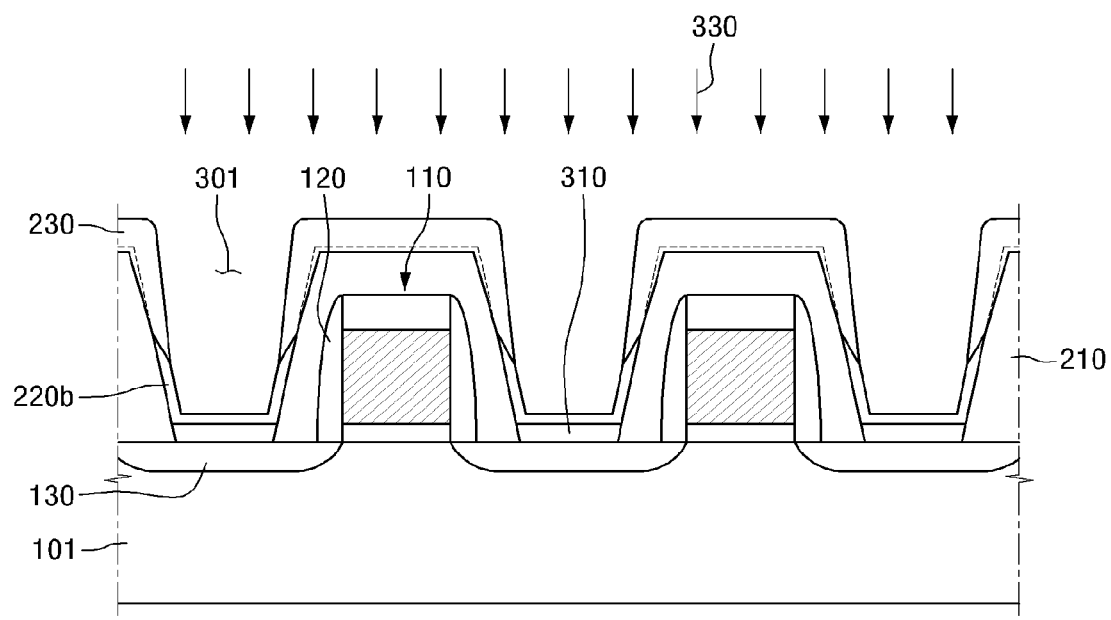

Referring to FIG. 12, the first region 220a of the first reaction layer 220 reacts with the first amount of etching gas 320, thereby forming a barrier layer 230.

Because the first amount of etching gas 320 is supplied in a small amount and at a low pressure, the first amount of etching gas 320 has low energy. Therefore, the first amount of etching gas 320 cannot reach a lower portion of the first trench 301, so that it reacts with only the first region 220a of the first reaction layer 220 to form the barrier layer 230 without reacting with the second region 220b of the first reaction layer 220.

The first amount of etching gas 320 reacts not only the first region 220a of the first reaction layer 220 but also a portion of the interlayer dielectric layer 210 disposed at a lower portion of the first region 220a of the first reaction layer 220, thereby partially etching the interlayer dielectric layer 210.

After the barrier layer 230 is formed, the second amount of etching gas 330 is supplied.

Figure 13:
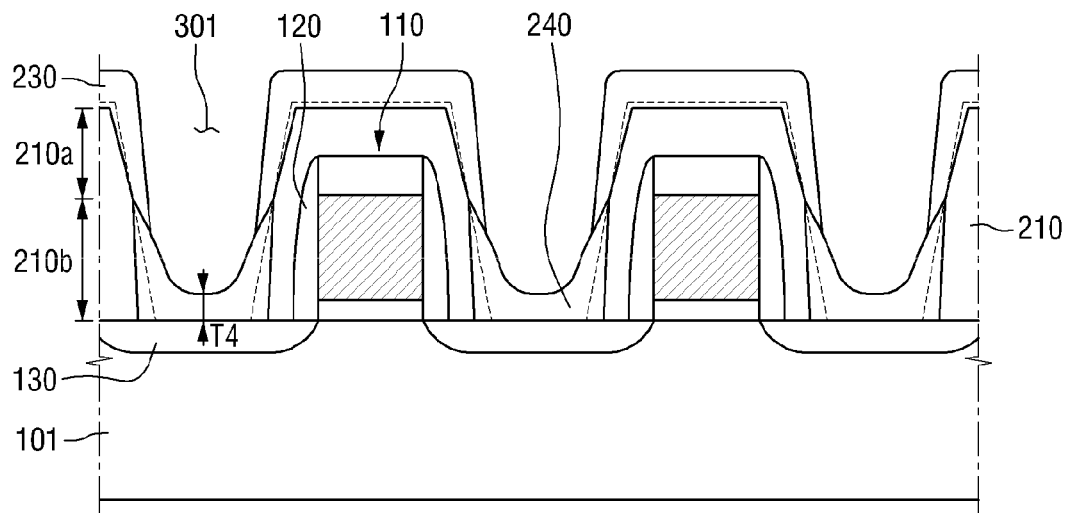

Referring to FIG. 13, the second amount of etching gas 330 reacts with the second region 220b of the first reaction layer 220, thereby removing the natural thin film 310 disposed at a lower portion of the second region 220b of the first reaction layer 220, the second amount being greater than the first amount.

Because the second amount of etching gas 330 has a higher pressure than the first amount of etching gas 320, it has higher energy than the first amount of etching gas 320. In addition, because the second amount is greater than the first amount, the second amount of etching gas 330 may reach the lower portion of the first trench 301 to then react with the second region 220b of the first reaction layer 220. Because the second amount of etching gas 330 has high energy, it may react with the interlayer dielectric layer 210 disposed at the lower portion of the second region 220b of the first reaction layer 220 and the natural thin film 310, thereby etching the interlayer dielectric layer 210 disposed at the lower portion of the second region 220b of the first reaction layer 220 and the natural thin film 310. Because both of the interlayer dielectric layer 210 and the natural thin film 310 are oxide layers, they may be etched. If the second region 220b of the first reaction layer 220 is formed only on the natural thin film 310, only the natural thin film 310 may be etched while the interlayer dielectric layer 210 is not etched.

Each of the first amount of etching gas 320 and the second amount of etching gas 330 may include at least one of HF and HF3. In order to increase reactivity of the second amount of etching gas 330, the second amount of etching gas 330 may further include an inert gas, $N_2$ and $NH_3$.

The interlayer dielectric layer 210 may be divided into a first region interlayer dielectric layer 210a disposed at a lower portion of the barrier layer 230 and a second region interlayer dielectric layer 210b disposed at a lower portion of the first region interlayer dielectric layer 210a. The first region interlayer dielectric layer 210a may not react with the second amount of etching gas 330 due to the presence of the barrier layer 230 formed on a top surface of the first region interlayer dielectric layer 210a. However, because the barrier layer 230 is not formed on sidewalls of the second region interlayer dielectric layer 210b, the second region interlayer dielectric layer 210b may react with the second amount of etching gas 330 to then be etched.

The second region 220b of the first reaction layer 220, the second region interlayer dielectric layer 210b, the natural thin film 310 and the second amount of etching gas 330 may react with one another, thereby forming a second reaction layer 240.

Because a small amount of the first region interlayer dielectric layer 210a reacts with the first amount of etching gas 320 having low energy, the first region interlayer dielectric layer 210a is etched by a small amount. However, because a large amount of the second region interlayer dielectric layer 210b reacts with the second amount of etching gas 330 having high energy, the second region interlayer dielectric layer 210b is etched by a large amount. In detail, the first region interlayer dielectric layer 210a is etched as much as a thickness T3, and the second region interlayer dielectric layer 220b and the natural thin film 310 are etched as much as a thickness T4, and T3 is smaller than T4. Therefore, in the course of removing the natural thin film 310, it is possible to prevent or reduce a critical dimension (CD) from increasing on the first trench 301.

Figure 14:
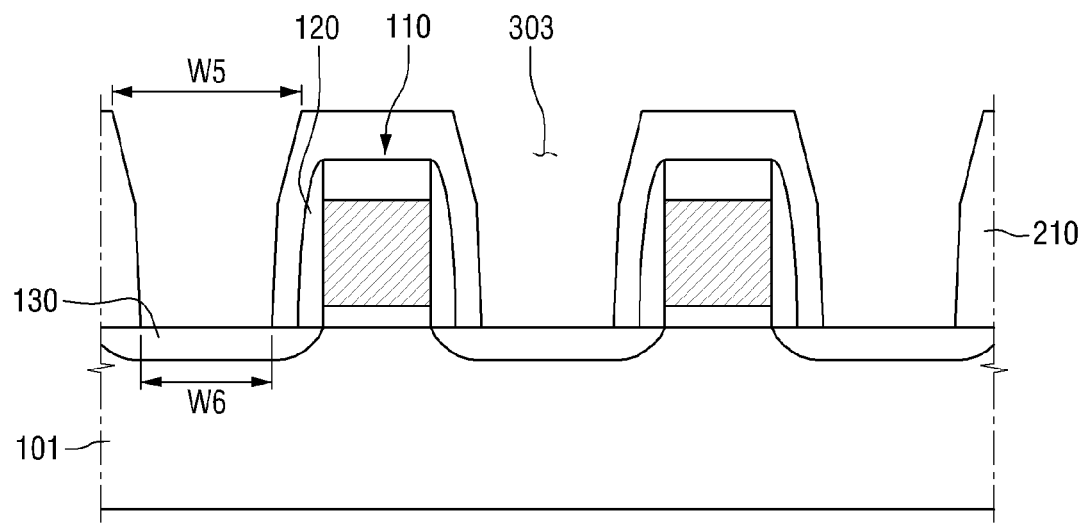

If post heat treatment (PHT) is performed, the barrier layer 230 and the second reaction layer 240 are removed, thereby forming a second trench 303, as shown in FIG. 14. If the second reaction layer 240 is removed, a top surface of the source/drain 130 is exposed.

When the second trench 303 is compared with the first trench (301 of FIG. 10), there is a small difference between an upper width W3 of the first trench 301 and an upper width W5 of the second trench 303, but the lower portion of the first trench 301 is selectively etched. Thus, there is a considerable difference between a lower width W4 of the first trench 301 and a lower width W6 of the second trench 303, and the lower width W6 of the second trench 303 is greater than the lower width W4 of the first trench 301.

A contact is formed in the second trench 303. As a result, a transistor having improved reliability can be fabricated.

A method for forming a trench of a semiconductor device according to example embodiments of the present inventive concepts will be described with reference to FIGS. 15 to 23.

FIGS. 15 to 23 illustrate intermediate process steps of a method for forming a trench of a semiconductor device according to example embodiments of the present inventive concepts.

Figure 15:
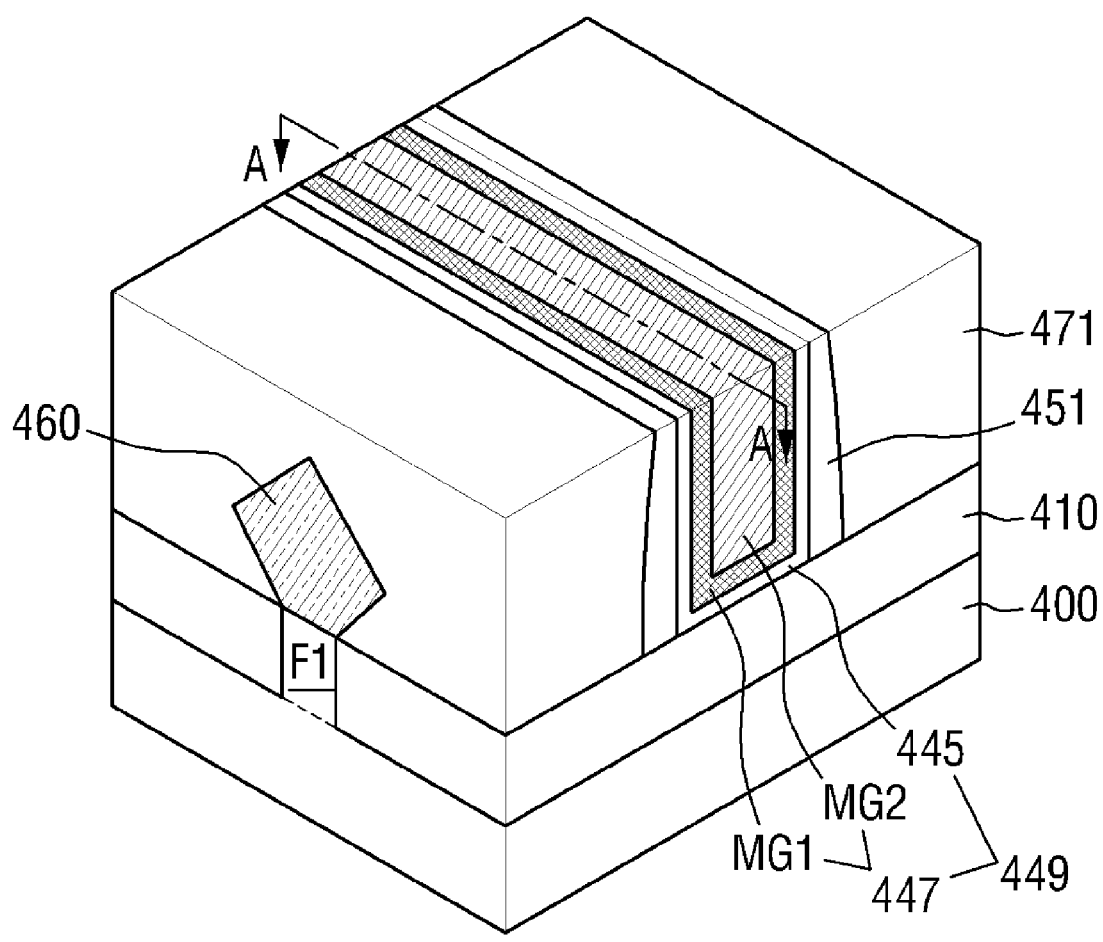
FIGS. 15 to 23 illustrate intermediate process steps of a method for forming a trench of a semiconductor device according to example embodiments of the present inventive concepts.
Figure 16:
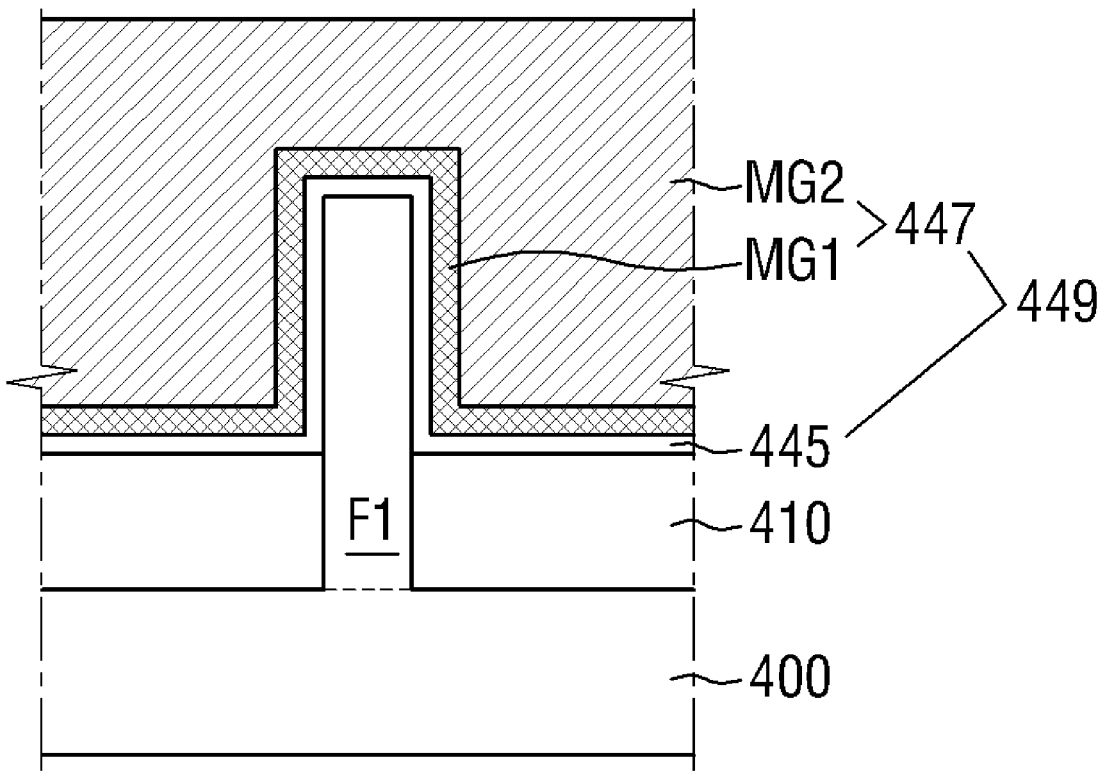
Figure 17:
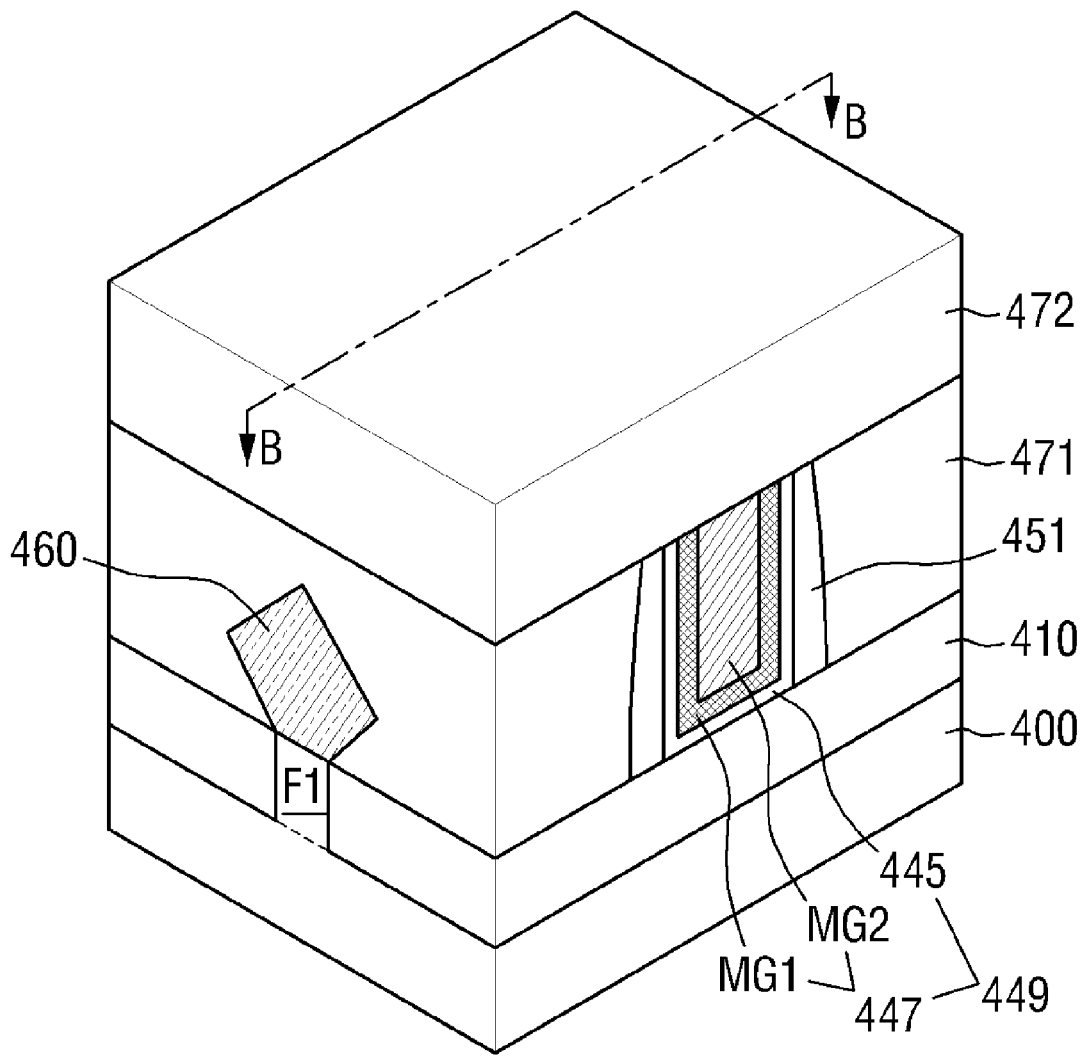

Specifically, FIG. 16 is a cross-sectional view taken along the line A-A of FIG. 15, and FIGS. 18 to 23 are cross-sectional views taken along the line B-B of FIG. 17.

Referring to FIGS. 15 and 16, a gate structure 449 is formed on a fin F1.

The fin F1 is formed on a substrate 400. The fin F1 may be formed by forming a mask pattern (not shown) on the substrate 400, followed by etching, but aspects of example embodiments of the present inventive concepts are not limited thereto. The fin F1 may extend in a second direction Y1.

An isolation layer 410 is formed on the substrate 400, the isolation layer 410 covering sidewalls of the fin F1. The isolation layer 410 may be made of at least one of a silicon oxide layer, a silicon nitride layer, and a silicon oxynitride layer.

A portion of the fin F1 protruding upwardly from the isolation layer 410 may be formed by an epitaxial process. In detail, after the isolation layer 410 is formed, portion of the fin F1 may be formed by the epitaxial process using as a seed a top surface of the fin F1 exposed by the isolation layer 410 without a recess process.

In addition, impurity may be doped into the fin F1 to adjust a threshold voltage. In a case where an NMOS transistor is to be formed, the impurity may be boron (B), and in a case where a PMOS transistor is to be formed, the impurity may be phosphorus (P) or arsenic (As).

A gate structure 449 extending in a first direction X1 while crossing the fin F1 is formed on the fin F1. The gate structure 449 includes a gate insulation layer 445 and a gate electrode 447. The gate insulation layer 445 may include a high-k material having a higher dielectric constant than a silicon oxide layer. For example, the gate insulation layer 445 may include $HfO_2$, $ZrO_2$ or $Ta_2O_5$. The gate insulation layer 445 may be conformally formed along sidewalls and top surface of the fin F1.

The gate electrode 447 may include metal layers MG1 and MG2. As shown, the gate electrode 447 may include two or more metal layers stacked one on another. The first metal layer MG1 may control a work function, and the second metal layer MG2 may fill a space formed by the first metal layer MG1. For example, the first metal layer MG1 may include at least one of TiN, TaN, TiC, and TaC. In addition, the second metal layer MG2 may include W or Al. Alternatively, the gate electrode 447 may include a material other than a metal, for example, Si or SiGe.

Like the gate insulation layer 445, the gate electrode 447 may also be conformally formed along sidewalls and top surface of the fin F1.

A spacer 451 is formed on sidewalls of the gate structure 449. The spacer 451 may include, for example, a silicon nitride layer or a silicon oxynitride layer.

A source/drain 460 may be formed at both sides of the gate structure 449. The source/drain 460 may be formed on the fin F1 whose top portion is partially removed. The source/drain 460 may be an elevated) source/drain. That is to say, a top surface of the source/drain 460 may be higher than a bottom surface of the first interlayer dielectric layer 471. The source/drain 460 and the gate electrode 447 may be insulated from each other by the spacer 451.

In a case where a P type transistor is to be formed, the source/drain 460 may include a compressive stress material. For example, the compressive stress material may be a material having a larger lattice constant than silicon (Si), for example, SiGe. The compressive stress material may improve the mobility of carriers of a channel region by applying compressive stress to the fin F1.

In a case where an N type transistor is to be formed, the source/drain 460 may include the same material as the substrate 400 or a tensile stress material. For example, when the substrate 400 includes Si, the first source/drain 161 may include Si or a material having a smaller lattice constant than Si (e.g., SiC).

The elevated source/drain 460 may be formed by an epitaxial process. The elevated source/drain 460 may have at least one shape of a diamond, a circle and a rectangle. The elevated source/drain 460 shaped of a diamond (or a pentagon or a hexagon) is exemplified in FIG. 15.

Unlike in FIG. 15, a bottom surface of the source/drain 460 may have a greater width than the top surface of the fin F1.

A first interlayer dielectric layer 471 is formed on the source/drain 460. A top surface of the first interlayer dielectric layer 471 and a top surface of the gate structure 449 are at the same height. The first interlayer dielectric layer 471 may be an oxide layer.

Figure 18:
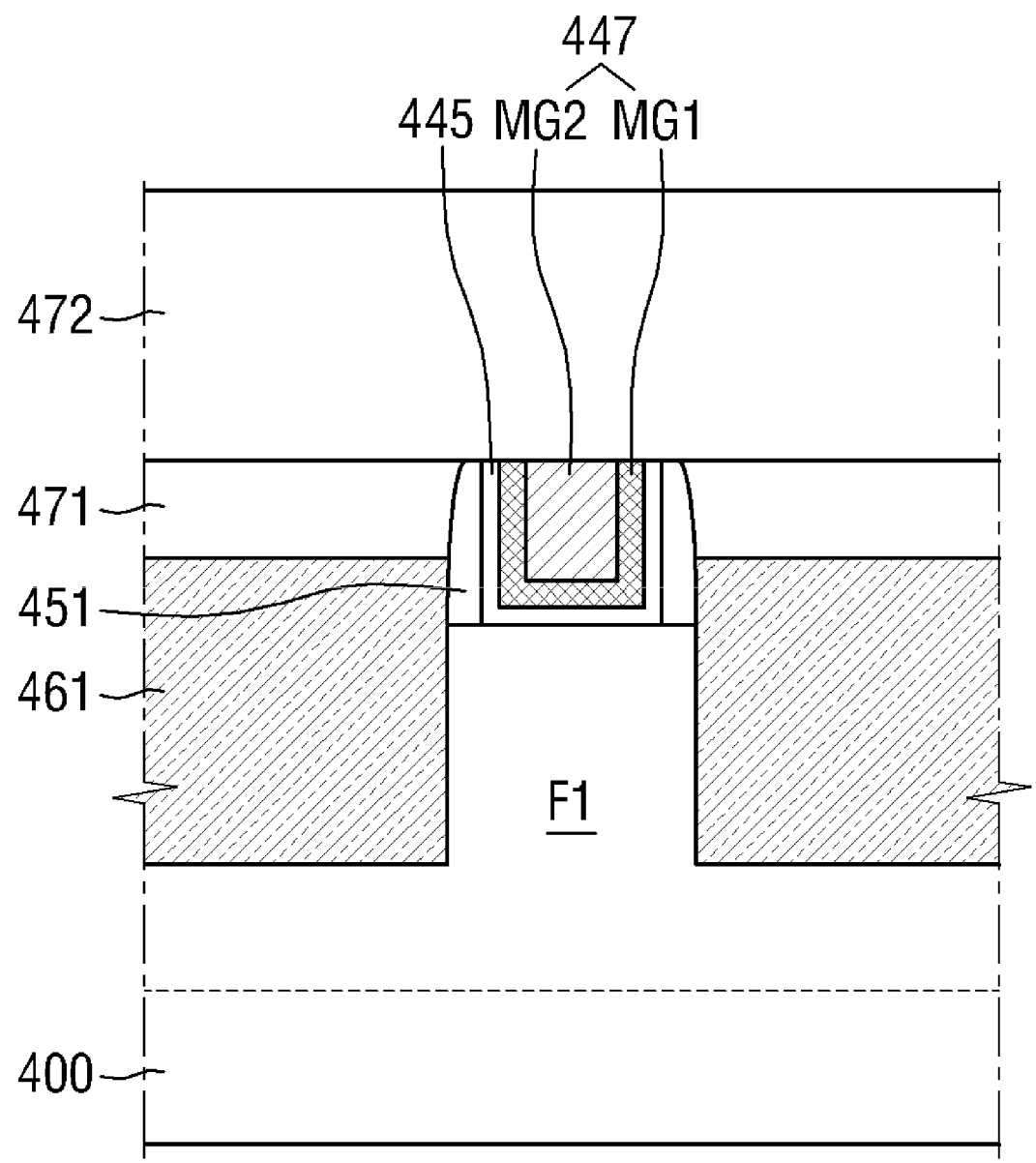

Referring to FIGS. 17 and 18, a second interlayer dielectric layer 472 is formed on the resultant product shown in FIG. 15. The second interlayer dielectric layer 472 may be an oxide layer.

Figure 19:
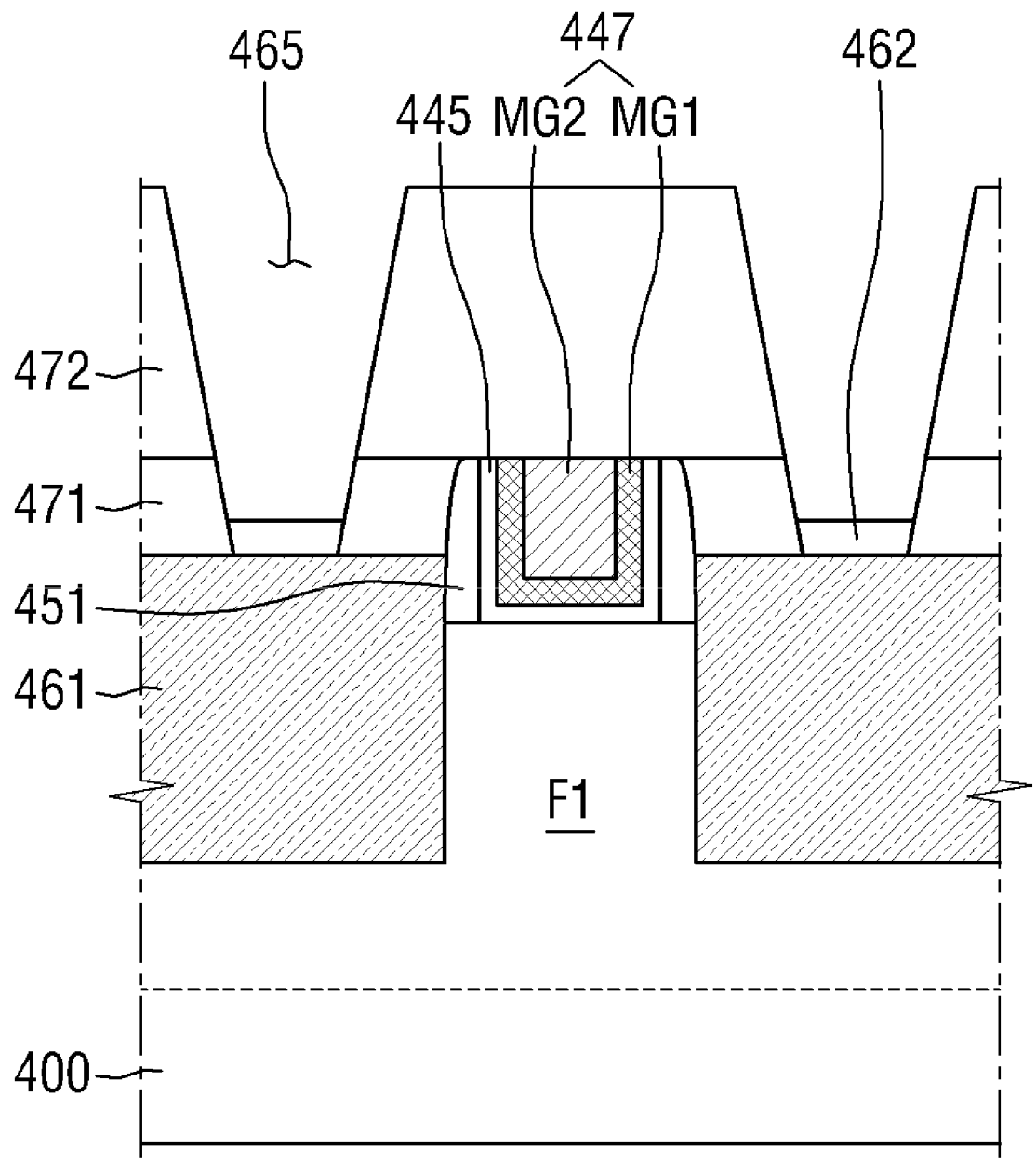

Referring to FIG. 19, a first trench 465 is formed on the source/drain 460, the first trench 465 passing through the first interlayer dielectric layer 471 and the second interlayer dielectric layer 472.

When the first trench 465 is formed, a natural thin film 462 is formed on the top surface of the source/drain 460. An etching gas used in the etching for forming the first trench 465 may interact with oxygen contained in the first and second interlayer dielectric layers 471 and 472. Accordingly, a thin film may be formed on the top surface of the source/drain 460 exposed by the first trench 465. The natural thin film 462 may be an oxide layer. The natural thin film 462 may have varying thicknesses according to processing conditions, including a processing time for the etching for forming the first trench 465.

Figure 20:
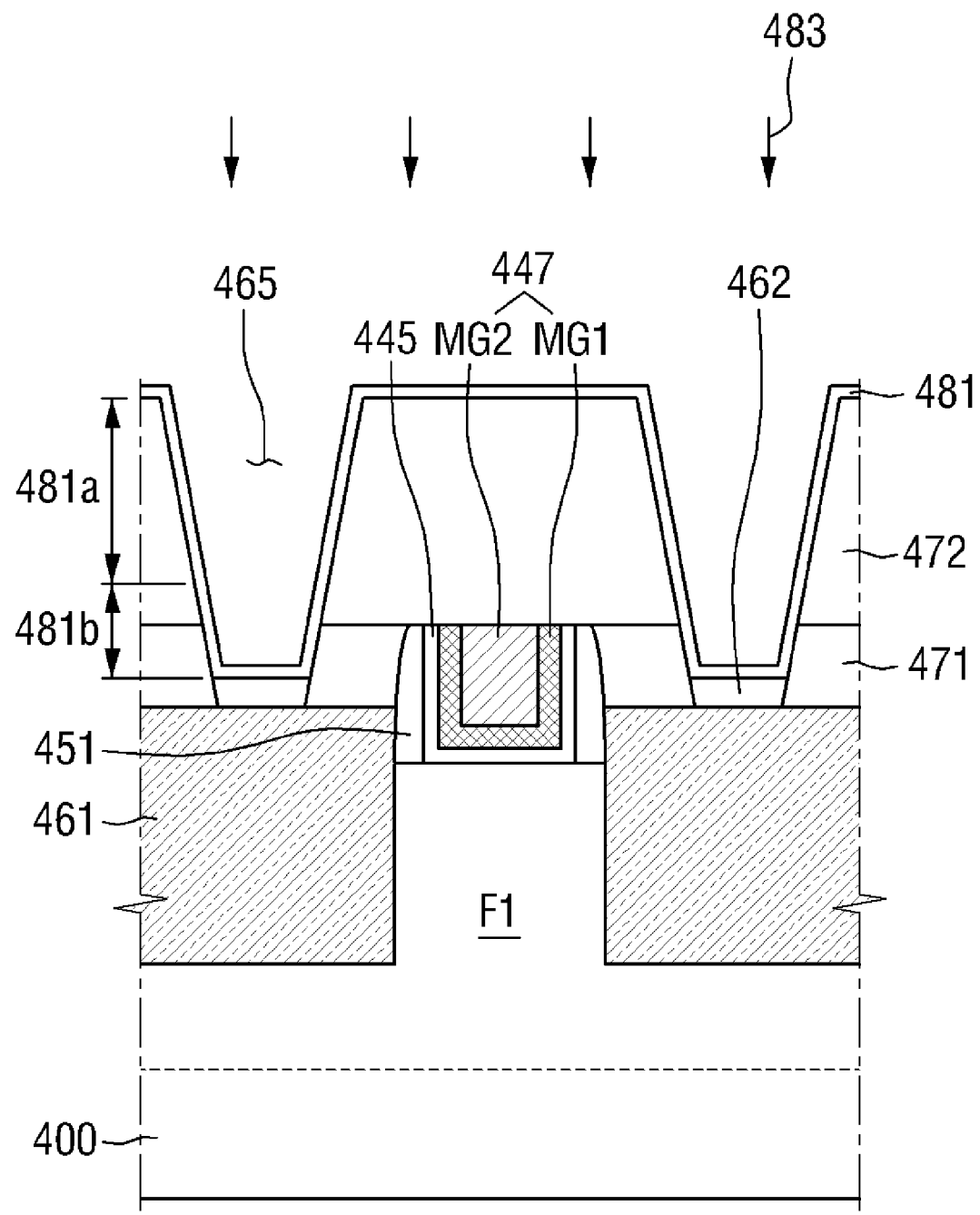

Referring to FIG. 20, a first reaction layer 481 is conformally formed along a top surface of the first trench 465. The first reaction layer 481 may include $NH_3$ and may also be formed on a top surface of the second interlayer dielectric layer 472.

Figure 21:
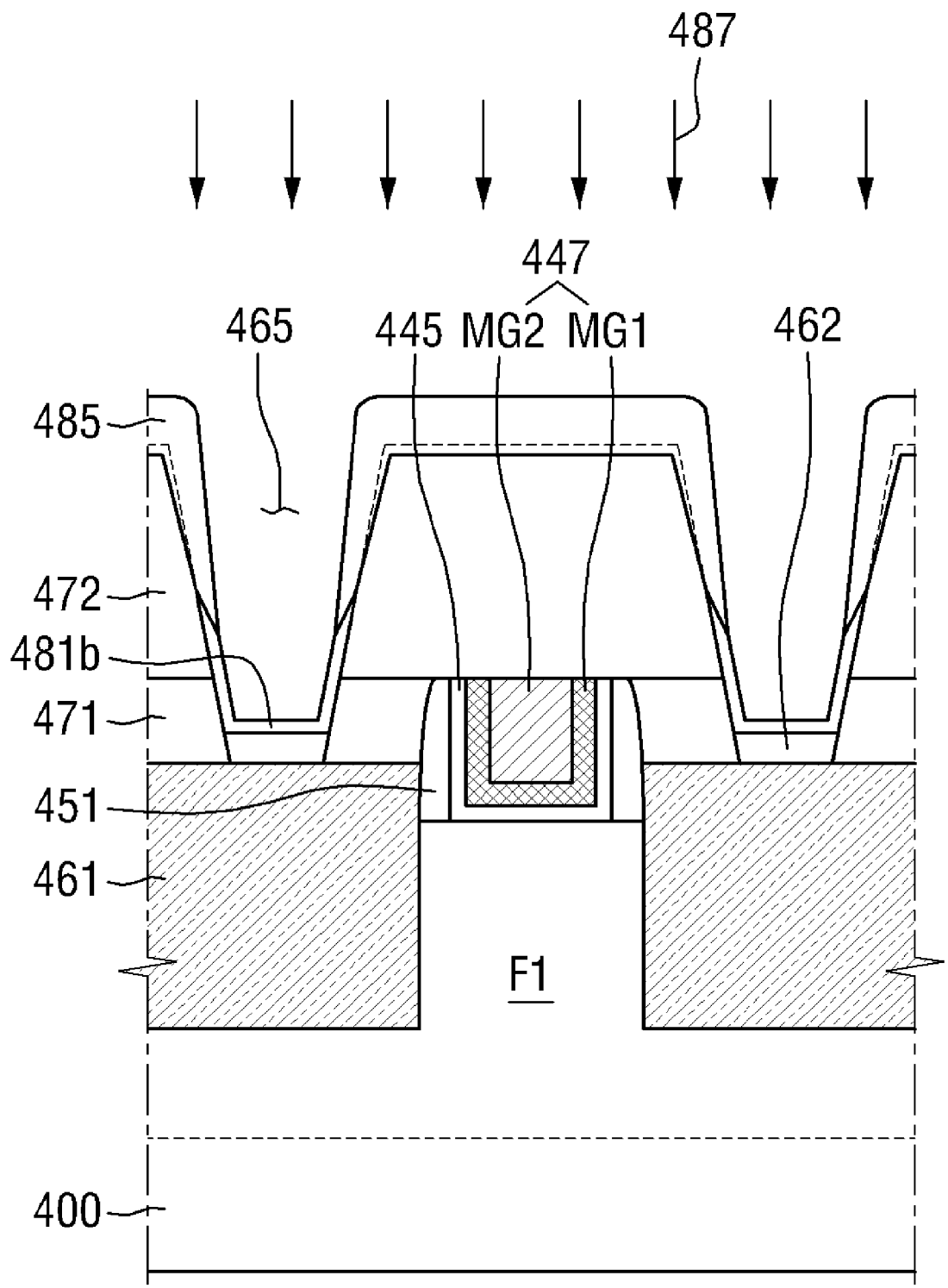

After the first reaction layer 481 is formed, a first amount of etching gas 483 is supplied. Referring to FIG. 21, the first amount of etching gas 483 reacts with a first region 481a of the first reaction layer 481 to form a barrier layer 485, while a second region 481b of the first reaction layer 481 remains.

The first amount of etching gas 483 reacts with the second interlayer dielectric layer 472 disposed at a lower portion of the first region 481a of the first reaction layer 481, thereby partially etching the second interlayer dielectric layer 472. The second interlayer dielectric layer 472 is etched by only a small amount, which is too negligible to affect performance of transistor.

In the illustrated embodiment, the barrier layer 485 is formed on only the second interlayer dielectric layer 472. However, the barrier layer 485 may be formed on the first interlayer dielectric layer 471 as well.

A second amount of etching gas 487 is supplied. Because the second amount is greater than the first amount, and the second amount of etching gas 487 is supplied at a high pressure, the second amount of etching gas 487 may react with the second region 481b of the first reaction layer 481 positioned at a lower portion of the first trench 465.

Figure 22:
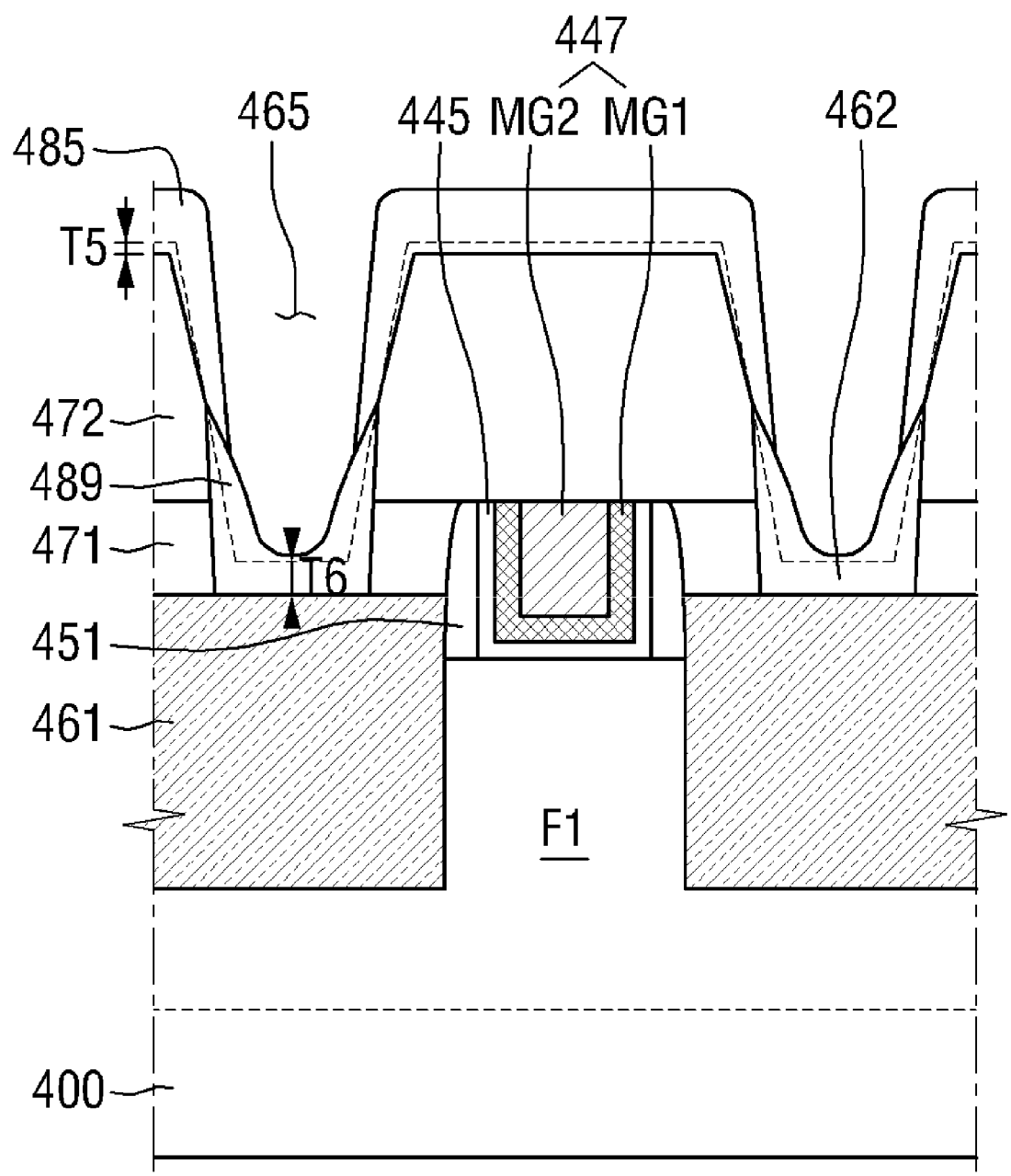

If the second amount of etching gas 487 reacts with the second region 481b of the first reaction layer 481, the first and second interlayer dielectric layers 471 and 472 disposed at lower portions of the second region 481b of the first reaction layer 481 and the natural thin film 462 are etched, as shown in FIG. 22. Here, a portion of the second interlayer dielectric layer 472, where the barrier layer 485 is formed, is not etched by the second amount of etching gas 487. Eventually, the natural thin film 462 may be selectively etched while maintaining a CD at an upper portion of the first trench 465.

A thickness T6 of each of the natural thin film 462 and the first and second interlayer dielectric layers 471 and 472, etched by the second amount of etching gas 487, may be greater than a thickness T6 of the second interlayer dielectric layer 472 etched by the first amount of etching gas 483.

The first and second interlayer dielectric layers 471 and 472, the natural thin film 462, the second region 481b of the first reaction layer 481 and the second amount of etching gas 487 may react with one another, thereby forming a second reaction layer 489 at the lower portion of the first trench 465.

If the second region 481b of the first reaction layer 481 covers only the first interlayer dielectric layer 471 and the natural thin film 462, the first interlayer dielectric layer 471, the natural thin film 462, the second region 481b of the first reaction layer 481 and the second amount of etching gas 487 react with one another, thereby forming the second reaction layer 489 at the lower portion of the first trench 465.

Figure 23:
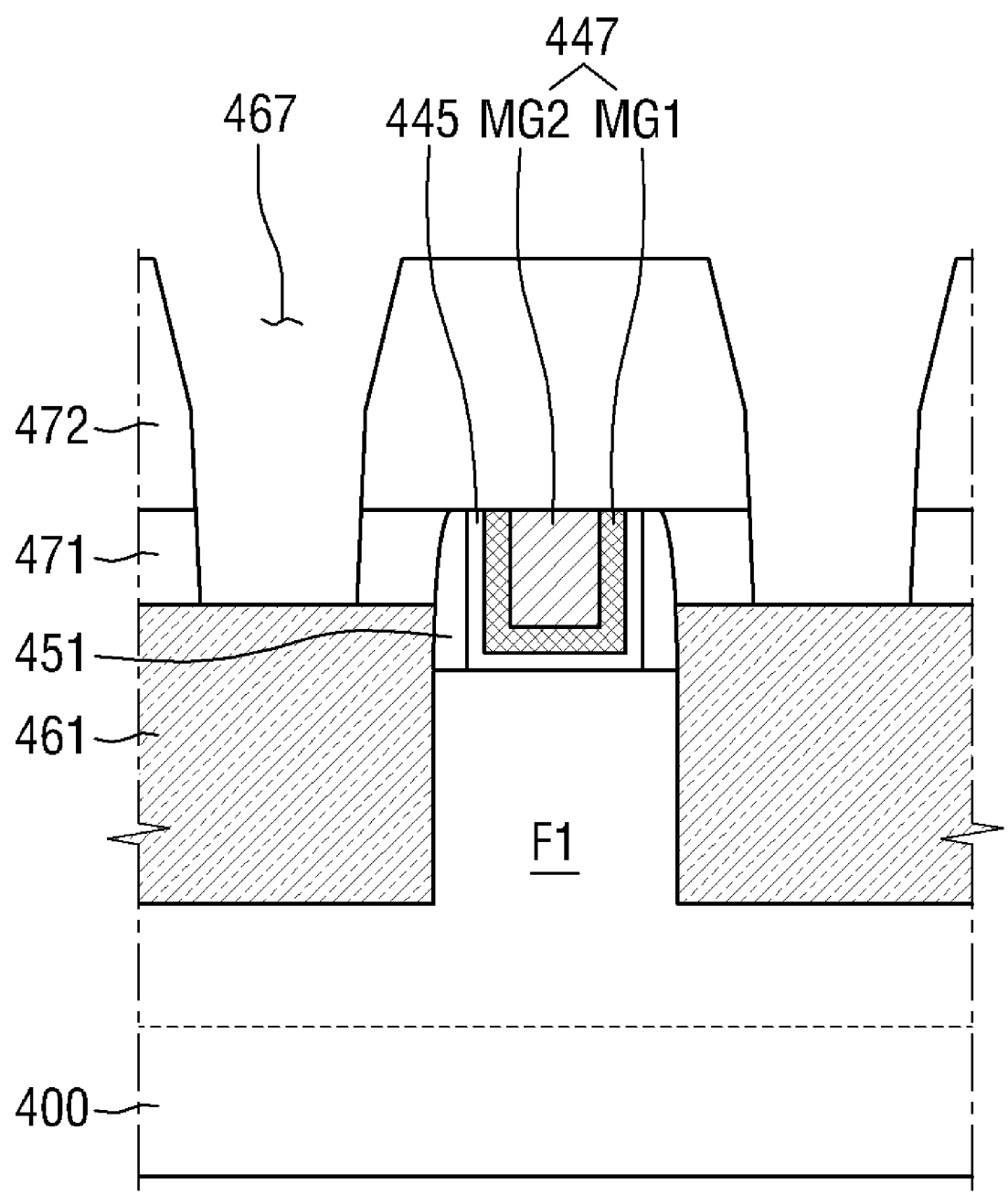

If post heat treatment (PHT) is performed, the barrier layer 485 and the second reaction layer 489 are removed, as shown in FIG. 23, and a second trench 467 exposing the top surface of the source/drain 460 is formed. The barrier layer 485 and the second reaction layer 489 are evaporated for removal.

A contact (not shown) may be formed in the second trench 467.

Hereinafter, an electronic system including a semiconductor device according to example embodiments of the present inventive concepts will be described with reference to FIG. 24.

Figure 24:
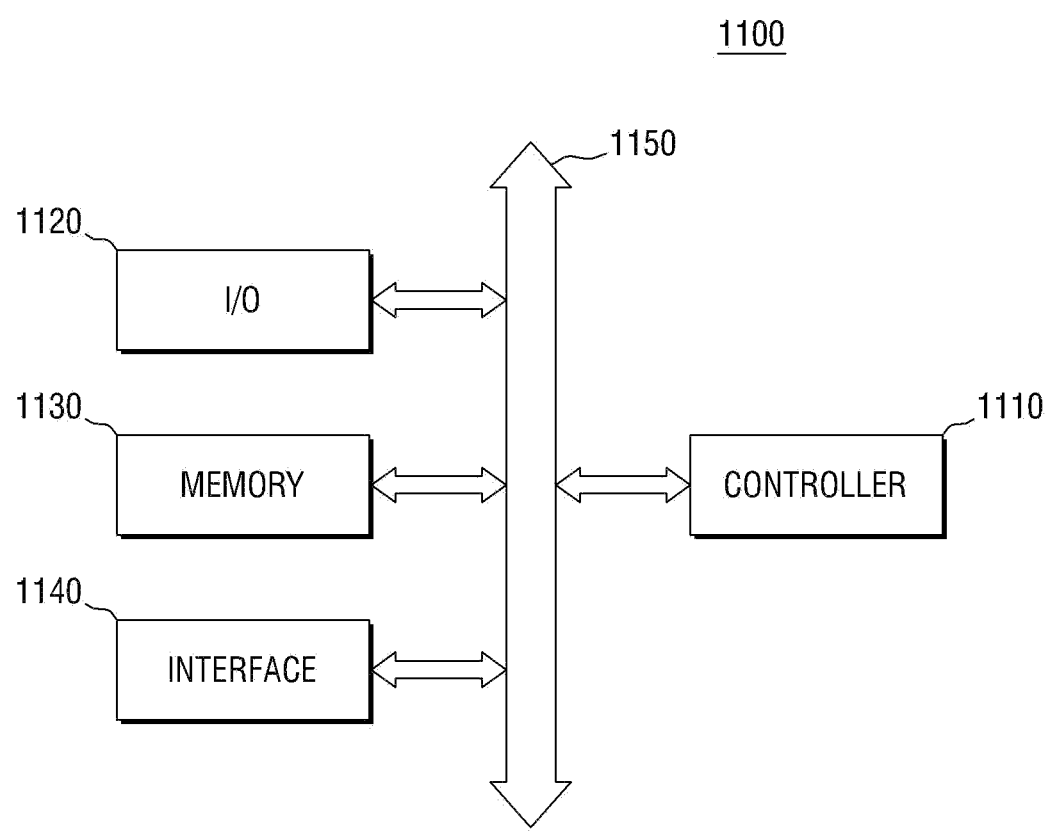
FIG. 24 is a block diagram of an electronic system including a semiconductor device according to example embodiments of the present inventive concepts.

FIG. 24 is a block diagram of an electronic system including a semiconductor device according to example embodiments of the present inventive concepts.

Referring to FIG. 24, the electronic system 1100 may include a controller 1110, an input/output device (I/O) 1120, a memory device 1130, an interface 1140 and a bus 1150. The controller 1110, the I/O 1120, the memory device 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a key pad, a key board, a display device, and so on. The memory device 1130 may store data and/or codes. The interface 1140 may perform functions of transmitting data to a communication network or receiving data from the communication network. The interface 1140 may be wired or wireless. For example, the interface 1140 may include an antenna or a wired/wireless transceiver, and so on. Although not shown, the electronic system 1100 may further include high-speed DRAM and/or SRAM as the operating memory for improving the operation of the controller 1110.

The semiconductor devices according to example embodiments of the present inventive concepts may be incorporated into the memory device 1130 or may be provided a component of the controller 1110 or the I/O 1120.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 25:
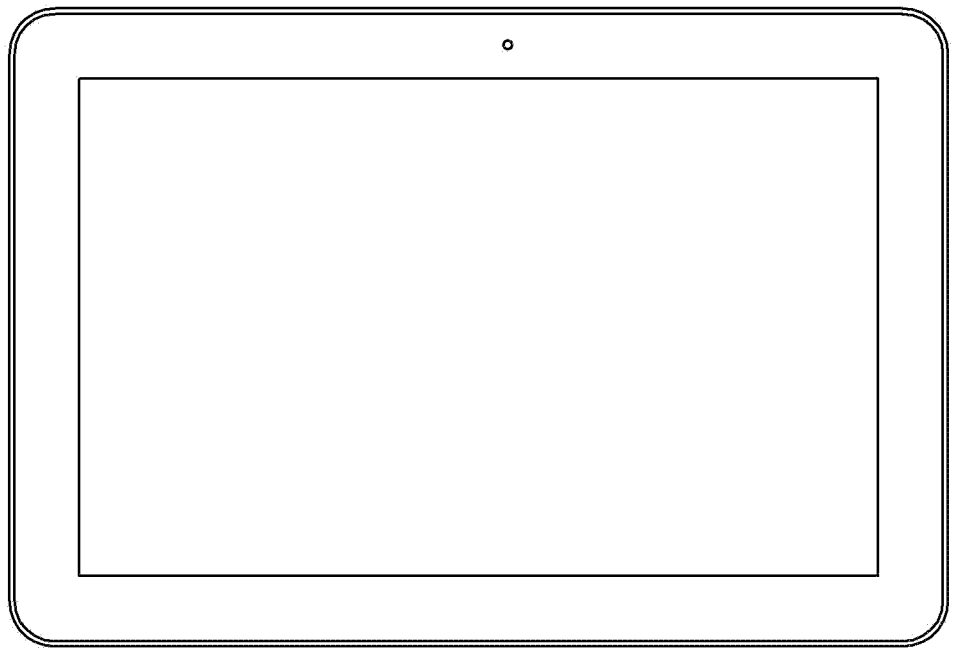
FIGS. 25 and 26 illustrate an exemplary semiconductor system to which semiconductor devices according to example embodiments of the present inventive concepts can be employed.
Figure 26:
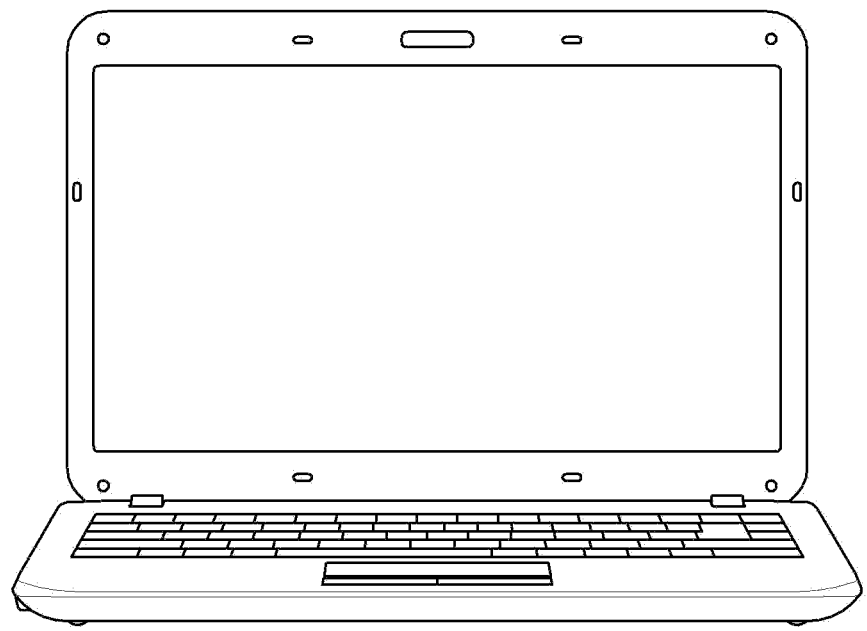

FIGS. 25 and 26 illustrate an exemplary semiconductor system to which semiconductor devices according to example embodiments of the present inventive concepts can be employed.

FIG. 25 illustrates an example in which a semiconductor device according to example embodiments of the present inventive concepts is applied to a tablet PC, and FIG. 26 illustrates an example in which a semiconductor device according to example embodiments of the present inventive concepts is applied to a notebook computer. At least one of the semiconductor devices according to example embodiments of the present inventive concepts can be employed to a tablet PC, a notebook computer, and the like. It is obvious to one skilled in the art that the semiconductor devices according to example embodiments of the present inventive concepts may also be applied to other IC devices not illustrated herein.

While example embodiments of the present inventive concepts have been particularly shown and described with reference to example embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of example embodiments of the inventive concepts.

What is claimed is:

1. A method for forming a trench of a semiconductor device, the method comprising:
    etching an oxide layer to form a trench therein;
    conformally forming a first reaction layer along a surface of the trench, the first reaction layer including a first region on an upper portion of the trench and a second region on a lower portion of the trench;
    forming a barrier layer by reacting a first amount of etching gas with the first region of the first reaction layer; and
    etching the oxide layer on a lower portion of the second region by reacting a second amount of etching gas with the second region of the first reaction layer, the second amount of etching gas being greater than the first amount of etching gas.

2. The method of claim 1, wherein the conformally forming forms the first reaction layer including $NH_3$.

3. The method of claim 1, wherein the etching gas includes at least one of HF and $HF_3$.

4. The method of claim 3, wherein the etching the oxide layer on a lower portion of the second region comprises etching the oxide layer using the etching gas including at least one of an inert gas, $N_2$ and $NH_3$.

5. The method of claim 1, wherein the forming a barrier layer comprises forming the barrier layer at a lower pressure than the etching the oxide layer on a lower portion of the second region.

6. The method of claim 1, wherein the conformally forming forms the first reaction layer on a top surface of the oxide layer.

7. The method of claim 6, wherein the forming a barrier layer forms the barrier layer on the top surface of the oxide layer.

8. The method of claim 1, wherein prior to the etching an oxide layer to form a trench therein, further comprising:
    forming a gate structure on a substrate;
    forming a source/drain on at least one side of the gate structure; and
    forming the oxide layer covering the substrate and the gate structure,
    wherein the trench is formed on the source/drain.

9. The method of claim 8, further comprising:
    forming a fin between the substrate and the gate structure.

10. The method of claim 8, wherein
    the etching an oxide layer to form a trench therein comprises exposing a top surface of the source/drain having a natural thin film formed thereon, and
    the etching an oxide layer on a lower portion of the second region comprises exposing the top surface of the source/drain by removing the natural thin film.

11. The method of claim 10, wherein the natural thin film is an oxide layer.

12. The method of claim 10, after the etching an oxide layer on a lower portion of the second region, further comprising:
    forming a contact in the trench.

13. A method for fabricating a semiconductor device, the method comprising:
  etching an insulation layer to form a trench therein, the insulation layer including a first region and a second region;
  conformally forming a first reaction layer along a surface of the insulation layer;
  forming a barrier layer by reacting an etching gas with the first reaction layer on a top surface of the first region, the first region being etched to a first thickness; and
  etching the second region to a second thickness greater than the first thickness by reacting the etching gas with the first reaction layer on a top surface of the second region.

14. The method of claim 13, wherein the etching an insulation layer etches an oxide layer.

15. The method of claim 13, wherein
  etching the second region includes using a first amount of the etching gas and a first pressure of the etching gas; and
  forming a barrier layer includes using a second amount of the etching gas and a second pressure of the etching gas, the second amount and the second pressure less than the first amount and the first pressure.

16. A method for forming a trench of a semiconductor device, the method comprising:
  etching an insulation layer to form a trench therein, the insulation layer including a first region and a second region;
  conformally forming a first reaction layer along a surface of the trench;
  forming a barrier layer by reacting a first amount of etching gas at a first pressure with the first reaction layer on a top surface of the first region; and
  etching the insulation layer by reacting a second amount of etching gas at a second pressure with the first reaction layer on a top surface of the second region, the second pressure being less than the first pressure and the second amount of etching gas being greater than the first amount of etching gas.

17. The method of claim 16, wherein the etching an insulation layer etches an oxide layer.

18. The method of claim 16, wherein the conformally forming forms the first reaction layer including $NH_3$.

19. The method of claim 16, wherein the etching gas includes at least one of HF and $HF_3$.

20. The method of claim 16, wherein prior to the etching an insulation layer to form a trench therein, further comprising:
  forming a gate structure on a substrate;
  forming a source/drain on at least one side of the gate structure; and
  forming the insulation layer covering the substrate and the gate structure,
  wherein the trench is formed on the source/drain.

* * * * *